(12) United States Patent
Fisher et al.

(10) Patent No.: US 12,514,755 B2
(45) Date of Patent: Jan. 6, 2026

(54) SENSOR INTEGRATED DRESSINGS AND SYSTEMS

(71) Applicant: Smith & Nephew PLC, Watford (GB)

(72) Inventors: Adam John Fisher, Hull (GB); Philip Gowans, Doncaster (GB); Daniel Stewart McKinlay, Hull (GB); Lee Ian Partington, Hessle (GB); Marcus Damian Phillips, West Yorkshire (GB); Felix Clarence Quintanar, Hull (GB); Kirsty Margaret Strachan, Hull (GB)

(73) Assignee: Smith & Nephew PLC, Watford (GB)

( * ) Notice: Subject to any disclaimer, the term of this patent is extended or adjusted under 35 U.S.C. 154(b) by 692 days.

(21) Appl. No.: 17/908,888

(22) PCT Filed: Mar. 4, 2021

(86) PCT No.: PCT/EP2021/055436
§ 371 (c)(1),
(2) Date: Sep. 1, 2022

(87) PCT Pub. No.: WO2021/175977
PCT Pub. Date: Sep. 10, 2021

(65) Prior Publication Data
US 2023/0090142 A1 Mar. 23, 2023

(30) Foreign Application Priority Data
Mar. 5, 2020 (GB) ....................................... 2003203

(51) Int. Cl.
*A61F 13/01* (2024.01)
*A61F 13/00* (2024.01)
(Continued)

(52) U.S. Cl.
CPC .. *A61F 13/01029* (2024.01); *A61F 13/00063* (2013.01); *A61F 13/00991* (2013.01); *A61F 13/05* (2024.01); *A61F 2013/8473* (2013.01)

(58) Field of Classification Search
CPC ................ A61F 13/01029; A61F 13/05; A61F 13/00063; A61F 13/00991;
(Continued)

(56) References Cited

U.S. PATENT DOCUMENTS

| 3,896,802 | A | 7/1975 | Williams |
| 4,334,530 | A | 6/1982 | Hassell |

(Continued)

FOREIGN PATENT DOCUMENTS

| CA | 3059516 A1 | 10/2018 |
| CN | 105232229 A | 1/2016 |

(Continued)

OTHER PUBLICATIONS

International Preliminary Report on Patentability for Application No. PCT/EP2021/055436, mailed on Sep. 15, 2022, 12 pages.

(Continued)

*Primary Examiner* — Daniel A Miller
(74) *Attorney, Agent, or Firm* — Knobbe, Martens, Olson & Bear, LLP

(57) ABSTRACT

In some cases, a wound dressing and a method for coating a wound dressing is provided. A first coating may be applied on a first side of a substantially flexible substrate of the wound dressing. The first side of the substrate may support a plurality of electronic components, electronic tracks, and a plurality of connectors between the electronic components and electronic tracks. The first coating may be applied to at least one connector of the plurality of connectors or to at least one electronic components of the plurality of electronic (Continued)

components to reinforce the at least one connector or the at least one electronic components.

7 Claims, 16 Drawing Sheets

(51) Int. Cl.
*A61F 13/05* (2024.01)
*A61F 13/84* (2006.01)

(58) Field of Classification Search
CPC .......... A61F 13/00051; A61F 13/0276; A61F 13/00055; A61F 13/01038; A61F 13/02; A61F 13/00987; A61F 13/0283; A61F 13/0286; A61F 2013/0094; A61B 5/6801; A61B 5/445; A61B 5/6831; A61B 5/053; A61B 2562/12; A61B 2562/227; A61B 2562/164; A61B 2560/0214
USPC .......................................................... 602/48
See application file for complete search history.

(56) References Cited

U.S. PATENT DOCUMENTS

| | | | |
|---|---|---|---|
| 5,090,410 A | 2/1992 | Saper et al. | |
| 5,253,654 A | 10/1993 | Thomas et al. | |
| 5,635,201 A | 6/1997 | Fabo | |
| 5,642,096 A | 6/1997 | Leyerer et al. | |
| 5,678,448 A | 10/1997 | Fullen et al. | |
| 5,690,610 A | 11/1997 | Ito et al. | |
| 5,836,990 A | 11/1998 | Li | |
| 6,095,992 A | 8/2000 | Augustine | |
| 6,178,342 B1 | 1/2001 | Borgos et al. | |
| 6,381,482 B1 | 4/2002 | Jayaraman et al. | |
| 6,517,484 B1 | 2/2003 | Wilk et al. | |
| 6,551,252 B2 | 4/2003 | Sackner et al. | |
| 6,731,987 B1 | 5/2004 | McAdams et al. | |
| 7,077,832 B2 | 7/2006 | Fleischmann | |
| 7,088,591 B2 | 8/2006 | Kishimoto et al. | |
| 7,201,063 B2 | 4/2007 | Taylor | |
| 7,206,623 B2 | 4/2007 | Blank et al. | |
| 7,289,205 B2 | 10/2007 | Yaroslavsky et al. | |
| 7,316,652 B2 | 1/2008 | Dalgaard et al. | |
| 7,429,255 B2 | 9/2008 | Thompson | |
| 7,520,875 B2 | 4/2009 | Bernabei | |
| 7,521,292 B2 | 4/2009 | Rogers et al. | |
| 7,625,117 B2 | 12/2009 | Haslett et al. | |
| 7,687,678 B2 | 3/2010 | Jacobs | |
| 7,846,141 B2 | 12/2010 | Weston | |
| 7,877,866 B1 | 2/2011 | Greenberg et al. | |
| 7,884,258 B2 | 2/2011 | Boehringer et al. | |
| 7,904,133 B2 | 3/2011 | Gehman et al. | |
| 7,922,676 B2 | 4/2011 | Daskal et al. | |
| 7,942,869 B2 | 5/2011 | Houbolt et al. | |
| 7,945,302 B2 | 5/2011 | McAdams | |
| 8,019,401 B1 | 9/2011 | Smith et al. | |
| 8,032,210 B2 | 10/2011 | Finneran et al. | |
| 8,060,174 B2 | 11/2011 | Simpson et al. | |
| 8,079,247 B2 | 12/2011 | Russell et al. | |
| 8,111,165 B2 | 2/2012 | Ortega et al. | |
| 8,116,841 B2 | 2/2012 | Bly et al. | |
| 8,182,425 B2 | 5/2012 | Stamatas et al. | |
| 8,238,996 B2 | 8/2012 | Burnes et al. | |
| 8,241,231 B2 | 8/2012 | Bausewein et al. | |
| 8,332,053 B1 | 12/2012 | Patterson et al. | |
| 8,333,874 B2 | 12/2012 | Currie | |
| 8,480,641 B2 | 7/2013 | Jacobs | |
| 8,525,340 B2 | 9/2013 | Eckhardt et al. | |
| 8,579,872 B2 | 11/2013 | Coulthard et al. | |
| 8,644,911 B1 | 2/2014 | Panasyuk et al. | |
| 8,682,442 B2 | 3/2014 | McAdams | |
| 8,783,948 B2 | 7/2014 | Panda et al. | |
| 8,788,009 B2 | 7/2014 | Greene et al. | |
| 8,800,386 B2 | 8/2014 | Taylor | |
| 8,818,478 B2 | 8/2014 | Scheffler et al. | |
| 8,848,187 B2 | 9/2014 | Uematsu et al. | |
| 8,894,590 B2 | 11/2014 | Lamoise et al. | |
| 8,925,392 B2 | 1/2015 | Esposito et al. | |
| 8,934,957 B2 | 1/2015 | Dias et al. | |
| 8,934,965 B2 | 1/2015 | Rogers et al. | |
| 8,943,897 B2 | 2/2015 | Beauvais et al. | |
| 8,948,839 B1 | 2/2015 | Longinotti-Buitoni et al. | |
| 8,997,588 B2 | 4/2015 | Taylor | |
| 9,000,251 B2 | 4/2015 | Murphy et al. | |
| 9,042,075 B2 | 5/2015 | Borini et al. | |
| 9,192,531 B2 | 11/2015 | Wu | |
| 9,204,806 B2 | 12/2015 | Stivoric et al. | |
| 9,220,455 B2 | 12/2015 | Sarrafzadeh et al. | |
| 9,282,897 B2 | 3/2016 | Ross, Jr. et al. | |
| 9,314,175 B2 | 4/2016 | Jacofsky et al. | |
| 9,320,473 B2 | 4/2016 | Shuler | |
| 9,372,123 B2 | 6/2016 | Li et al. | |
| 9,378,450 B1 | 6/2016 | Mei et al. | |
| 9,380,698 B1 | 6/2016 | Li et al. | |
| 9,386,947 B2 | 7/2016 | Johnson | |
| 9,393,354 B2 | 7/2016 | Freedman et al. | |
| 9,402,988 B2 | 8/2016 | Buchanan et al. | |
| 9,408,573 B2 | 8/2016 | Welch et al. | |
| 9,427,179 B2 | 8/2016 | Mestrovic et al. | |
| 9,439,599 B2 | 9/2016 | Thompson et al. | |
| 9,483,726 B2 | 11/2016 | Mei et al. | |
| 9,494,474 B2 | 11/2016 | Servati et al. | |
| 9,511,215 B2 | 12/2016 | Skiba | |
| 9,516,758 B2 | 12/2016 | Arora et al. | |
| 9,526,439 B2 | 12/2016 | Connelly et al. | |
| 9,554,484 B2 | 1/2017 | Rogers et al. | |
| 9,572,507 B2 | 2/2017 | Moore et al. | |
| 9,582,072 B2 | 2/2017 | Connor | |
| 9,585,620 B2 | 3/2017 | Paquet et al. | |
| 9,587,991 B2 | 3/2017 | Padiy | |
| 9,592,007 B2 | 3/2017 | Nuovo et al. | |
| 9,603,560 B2 | 3/2017 | Monty et al. | |
| 9,610,388 B2 | 4/2017 | Aceto et al. | |
| 9,613,911 B2 | 4/2017 | Rogers et al. | |
| 9,629,584 B2 | 4/2017 | Macia et al. | |
| 9,675,238 B2 | 6/2017 | Iida et al. | |
| 9,687,195 B2 | 6/2017 | Sims et al. | |
| 9,717,565 B2 | 8/2017 | Blair | |
| 9,844,145 B2 | 12/2017 | Hsu | |
| 9,907,103 B2 | 2/2018 | Chen et al. | |
| 9,999,711 B2 | 6/2018 | Weston et al. | |
| 10,004,643 B2 | 6/2018 | Luckemeyer et al. | |
| 10,046,096 B2 | 8/2018 | Askem et al. | |
| 10,080,524 B1 | 9/2018 | Xi | |
| 10,086,117 B2 | 10/2018 | Locke et al. | |
| 10,117,705 B2 | 11/2018 | Chernov et al. | |
| 10,152,789 B2 | 12/2018 | Carnes et al. | |
| 10,166,387 B2 | 1/2019 | Bergelin et al. | |
| 10,182,740 B2 | 1/2019 | Tonar et al. | |
| 10,201,644 B2 | 2/2019 | Haggstrom et al. | |
| 10,206,604 B2 | 2/2019 | Bergelin et al. | |
| 10,207,031 B2 | 2/2019 | Toth | |
| 10,209,213 B2 | 2/2019 | Kang et al. | |
| 10,285,620 B2 | 5/2019 | Jung et al. | |
| 10,288,590 B2 | 5/2019 | Hammond et al. | |
| 10,321,862 B2 | 6/2019 | Dalene et al. | |
| 10,463,773 B2 | 11/2019 | Haggstrom et al. | |
| 10,687,984 B2 | 6/2020 | Rovaniemi | |
| 10,702,153 B2 | 7/2020 | Shamim et al. | |
| 10,716,490 B2 | 7/2020 | Connolly | |
| 10,857,038 B2 | 12/2020 | Zamierowski et al. | |
| 11,026,847 B2 | 6/2021 | Piotrowski et al. | |
| 11,229,553 B2 | 1/2022 | Chen et al. | |
| 11,647,922 B2 | 5/2023 | Scherer | |
| 11,850,121 B2 | 12/2023 | Rapp | |
| 2002/0016536 A1 | 2/2002 | Benni | |
| 2002/0135752 A1 | 9/2002 | Sokolov et al. | |
| 2003/0033032 A1 | 2/2003 | Lind et al. | |
| 2003/0208148 A1 | 11/2003 | Sullivan | |
| 2003/0210810 A1 | 11/2003 | Gee, Jr. et al. | |
| 2003/0216630 A1 | 11/2003 | Jersey-Willuhn et al. | |
| 2004/0230132 A1 | 11/2004 | Shehada | |

(56) References Cited

U.S. PATENT DOCUMENTS

| | | |
|---|---|---|
| 2005/0088832 A1 | 4/2005 | Su et al. |
| 2005/0240107 A1 | 10/2005 | Alfano et al. |
| 2005/0280531 A1 | 12/2005 | Fadem et al. |
| 2006/0058690 A1 | 3/2006 | Bartnik et al. |
| 2006/0181791 A1 | 8/2006 | Van Beek et al. |
| 2006/0234383 A1 | 10/2006 | Gough |
| 2006/0241495 A1 | 10/2006 | Kurtz |
| 2007/0055209 A1 | 3/2007 | Patel et al. |
| 2007/0173892 A1 | 7/2007 | Fleischer et al. |
| 2007/0191754 A1 | 8/2007 | Aali |
| 2007/0260421 A1 | 11/2007 | Berner, Jr. et al. |
| 2007/0293748 A1 | 12/2007 | Engvall et al. |
| 2008/0081973 A1 | 4/2008 | Hoarau |
| 2008/0167535 A1 | 7/2008 | Stivoric et al. |
| 2008/0258717 A1 | 10/2008 | Igney et al. |
| 2008/0287747 A1 | 11/2008 | Mestrovic et al. |
| 2008/0319282 A1 | 12/2008 | Tran |
| 2008/0319283 A1 | 12/2008 | Cotton et al. |
| 2009/0149800 A1 | 6/2009 | Durand |
| 2009/0177051 A1 | 7/2009 | Arons et al. |
| 2009/0177110 A1 | 7/2009 | Lyden et al. |
| 2009/0209830 A1 | 8/2009 | Nagle et al. |
| 2009/0209896 A1 | 8/2009 | Selevan |
| 2009/0234206 A1 | 9/2009 | Gaspard et al. |
| 2009/0245601 A1 | 10/2009 | Cohen et al. |
| 2010/0022990 A1 | 1/2010 | Karpowicz et al. |
| 2010/0025831 A1 | 2/2010 | Yamazaki et al. |
| 2010/0166252 A1 | 7/2010 | Ahmed et al. |
| 2010/0168727 A1 | 7/2010 | Hancock et al. |
| 2010/0268111 A1 | 10/2010 | Drinan et al. |
| 2010/0305473 A1 | 12/2010 | Yuzhakov |
| 2011/0004088 A1 | 1/2011 | Grossman |
| 2011/0015591 A1 | 1/2011 | Hanson et al. |
| 2011/0054283 A1 | 3/2011 | Shuler |
| 2011/0130697 A1 | 6/2011 | Nagle et al. |
| 2011/0140703 A1 | 6/2011 | Chiao et al. |
| 2011/0190639 A1 | 8/2011 | Peltie et al. |
| 2011/0218757 A1 | 9/2011 | Callsen et al. |
| 2011/0242532 A1 | 10/2011 | McKenna |
| 2011/0245682 A1 | 10/2011 | Robinson et al. |
| 2011/0301441 A1 | 12/2011 | Bandic et al. |
| 2012/0029306 A1 | 2/2012 | Paquet et al. |
| 2012/0029307 A1 | 2/2012 | Paquet et al. |
| 2012/0029410 A1 | 2/2012 | Koenig et al. |
| 2012/0165717 A1 | 6/2012 | Al Khaburi |
| 2012/0190989 A1 | 7/2012 | Kaiser et al. |
| 2012/0265120 A1 | 10/2012 | Beisang, III et al. |
| 2012/0271265 A1 | 10/2012 | Langdon |
| 2012/0277559 A1 | 11/2012 | Kohl-Bareis et al. |
| 2012/0316538 A1 | 12/2012 | Heiser et al. |
| 2012/0330252 A1 | 12/2012 | Stokes et al. |
| 2013/0041235 A1 | 2/2013 | Rogers et al. |
| 2013/0064772 A1 | 3/2013 | Swiss et al. |
| 2013/0121544 A1 | 5/2013 | Sarrafzadeh et al. |
| 2013/0123722 A1 | 5/2013 | Pratt et al. |
| 2013/0151223 A1 | 6/2013 | Zamierowski et al. |
| 2013/0200268 A1 | 8/2013 | Rafferty et al. |
| 2013/0261409 A1 | 10/2013 | Pathak et al. |
| 2013/0271278 A1 | 10/2013 | Duesterhoft et al. |
| 2013/0274563 A1 | 10/2013 | Duesterhoft et al. |
| 2013/0274629 A1 | 10/2013 | Duesterhoft et al. |
| 2013/0317367 A1 | 11/2013 | Shuler |
| 2014/0012108 A1 | 1/2014 | McPeak |
| 2014/0018637 A1 | 1/2014 | Bennett et al. |
| 2014/0024905 A1 | 1/2014 | Sarrafzadeh et al. |
| 2014/0031663 A1 | 1/2014 | Gallego et al. |
| 2014/0072190 A1 | 3/2014 | Wu et al. |
| 2014/0075658 A1 | 3/2014 | McGuin |
| 2014/0107495 A1 | 4/2014 | Marinelli et al. |
| 2014/0107498 A1 | 4/2014 | Bower et al. |
| 2014/0147611 A1 | 5/2014 | Ackerman, Jr. |
| 2014/0203797 A1 | 7/2014 | Stivoric et al. |
| 2014/0206947 A1 | 7/2014 | Isserow et al. |
| 2014/0232516 A1 | 8/2014 | Stivoric et al. |
| 2014/0235166 A1 | 8/2014 | Molettiere et al. |
| 2014/0243709 A1 | 8/2014 | Gibson et al. |
| 2014/0296749 A1 | 10/2014 | Reid, Jr. et al. |
| 2014/0298927 A1 | 10/2014 | Allin et al. |
| 2014/0298928 A1 | 10/2014 | Duesterhoft et al. |
| 2014/0303463 A1 | 10/2014 | Robinson et al. |
| 2014/0324120 A1 | 10/2014 | Bogie et al. |
| 2014/0340857 A1 | 11/2014 | Hsu et al. |
| 2014/0343478 A1 | 11/2014 | Brennan et al. |
| 2014/0350882 A1 | 11/2014 | Everett et al. |
| 2015/0018792 A1 | 1/2015 | Marsiquet et al. |
| 2015/0025343 A1 | 1/2015 | Gareau et al. |
| 2015/0138330 A1 | 5/2015 | Krishnamoorthi |
| 2015/0141767 A1 | 5/2015 | Rogers et al. |
| 2015/0148760 A1 | 5/2015 | Dodd et al. |
| 2015/0150479 A1 | 6/2015 | Yoshino et al. |
| 2015/0182166 A1 | 7/2015 | Evans et al. |
| 2015/0223716 A1 | 8/2015 | Korkala et al. |
| 2015/0257644 A1 | 9/2015 | Cao |
| 2015/0265191 A1 | 9/2015 | Harding et al. |
| 2015/0292968 A1 | 10/2015 | Vogt et al. |
| 2015/0313476 A1 | 11/2015 | Pisani et al. |
| 2015/0313533 A1 | 11/2015 | Rapp et al. |
| 2015/0327777 A1 | 11/2015 | Kostic et al. |
| 2015/0335254 A1 | 11/2015 | Fastert et al. |
| 2015/0335287 A1 | 11/2015 | Neuman et al. |
| 2015/0335288 A1 | 11/2015 | Toth et al. |
| 2015/0351970 A1 | 12/2015 | Dagger et al. |
| 2015/0359485 A1 | 12/2015 | Berg et al. |
| 2015/0374309 A1 | 12/2015 | Farkas et al. |
| 2016/0015962 A1 | 1/2016 | Shokoueinejad Maragheh et al. |
| 2016/0022223 A1 | 1/2016 | Grundfest et al. |
| 2016/0029900 A1 | 2/2016 | LaPlante et al. |
| 2016/0030132 A1 | 2/2016 | Cheung et al. |
| 2016/0038045 A1 | 2/2016 | Shapiro |
| 2016/0038083 A1 | 2/2016 | Ding et al. |
| 2016/0051147 A1 | 2/2016 | Cohen et al. |
| 2016/0058380 A1 | 3/2016 | Lee et al. |
| 2016/0066854 A1 | 3/2016 | Mei et al. |
| 2016/0069743 A1 | 3/2016 | McQuilkin et al. |
| 2016/0074234 A1 | 3/2016 | Abichandani et al. |
| 2016/0081601 A1 | 3/2016 | Ballam et al. |
| 2016/0100790 A1 | 4/2016 | Cantu et al. |
| 2016/0100987 A1 | 4/2016 | Hartwell et al. |
| 2016/0129469 A1 | 5/2016 | Kulinsky et al. |
| 2016/0143534 A1 | 5/2016 | Hyde et al. |
| 2016/0157779 A1 | 6/2016 | Baxi et al. |
| 2016/0213269 A1 | 7/2016 | Lam et al. |
| 2016/0228049 A1 | 8/2016 | Nackaerts et al. |
| 2016/0232807 A1 | 8/2016 | Ghaffari et al. |
| 2016/0242331 A1 | 8/2016 | Park et al. |
| 2016/0249810 A1 | 9/2016 | Darty et al. |
| 2016/0262672 A1 | 9/2016 | Hammond et al. |
| 2016/0262687 A1 | 9/2016 | Vaidyanathan et al. |
| 2016/0270700 A1 | 9/2016 | Baxi et al. |
| 2016/0287177 A1 | 10/2016 | Huppert et al. |
| 2016/0302729 A1 | 10/2016 | Starr et al. |
| 2016/0310023 A1 | 10/2016 | Chachisvilis et al. |
| 2016/0317057 A1 | 11/2016 | Li et al. |
| 2016/0331263 A1 | 11/2016 | Cailler et al. |
| 2016/0331322 A1 | 11/2016 | Son et al. |
| 2016/0338591 A1 | 11/2016 | Lachenbruch et al. |
| 2016/0354001 A1 | 12/2016 | Buckley et al. |
| 2016/0367189 A1 | 12/2016 | Aimone et al. |
| 2016/0367192 A1 | 12/2016 | Iyengar et al. |
| 2016/0367406 A1 | 12/2016 | Barnett |
| 2017/0000407 A1 | 1/2017 | Saxby et al. |
| 2017/0007853 A1 | 1/2017 | Alford et al. |
| 2017/0027498 A1 | 2/2017 | Larson et al. |
| 2017/0079740 A1 | 3/2017 | Hufnagel et al. |
| 2017/0086519 A1 | 3/2017 | Vigano' et al. |
| 2017/0086709 A1 | 3/2017 | Khine et al. |
| 2017/0095208 A1 | 4/2017 | Oberleitner et al. |
| 2017/0146474 A1 | 5/2017 | Bedell et al. |
| 2017/0156594 A1 | 6/2017 | Stivoric et al. |
| 2017/0156621 A1 | 6/2017 | Bettinger et al. |
| 2017/0156658 A1 | 6/2017 | Maharbiz et al. |
| 2017/0164865 A1 | 6/2017 | Rafferty et al. |
| 2017/0164876 A1 | 6/2017 | Hyde et al. |
| 2017/0172439 A1 | 6/2017 | Zhu et al. |

(56) References Cited

U.S. PATENT DOCUMENTS

| | | |
|---|---|---|
| 2017/0202711 A1 | 7/2017 | Cernasov et al. |
| 2017/0224271 A1 | 8/2017 | Lachenbruch et al. |
| 2017/0231015 A1 | 8/2017 | Jang et al. |
| 2017/0258972 A1 | 9/2017 | Weston |
| 2017/0319075 A1 | 11/2017 | Homan et al. |
| 2017/0326004 A1 | 11/2017 | Long et al. |
| 2017/0367644 A1 | 12/2017 | Sharman et al. |
| 2018/0003579 A1 | 1/2018 | Esposito et al. |
| 2018/0008177 A1 | 1/2018 | Shimuta et al. |
| 2018/0055697 A1 | 3/2018 | Mihali et al. |
| 2018/0056087 A1 | 3/2018 | Ribeiro et al. |
| 2018/0070880 A1 | 3/2018 | Trembly et al. |
| 2018/0074547 A1 | 3/2018 | Smadi et al. |
| 2018/0116877 A1 | 5/2018 | Ineichen |
| 2018/0132287 A1 | 5/2018 | Cheng et al. |
| 2018/0192514 A1 | 7/2018 | Seo |
| 2018/0200414 A1 | 7/2018 | Askem et al. |
| 2018/0206758 A1 | 7/2018 | Feldkamp et al. |
| 2018/0235484 A1 | 8/2018 | Mozdzierz |
| 2018/0296397 A1 | 10/2018 | Askem et al. |
| 2019/0021911 A1 | 1/2019 | Askem et al. |
| 2019/0060126 A1 | 2/2019 | Ribble et al. |
| 2019/0076298 A1 | 3/2019 | Quintanar et al. |
| 2019/0083025 A1 | 3/2019 | Aung et al. |
| 2019/0133812 A1 | 5/2019 | Seres et al. |
| 2019/0159938 A1 | 5/2019 | Askem et al. |
| 2019/0175098 A1 | 6/2019 | Burns |
| 2019/0192066 A1 | 6/2019 | Schoess et al. |
| 2019/0231939 A1 | 8/2019 | Askem et al. |
| 2019/0290496 A1 | 9/2019 | Brownhill et al. |
| 2019/0374387 A1 | 12/2019 | Ribble et al. |
| 2020/0054218 A1 | 2/2020 | Xi |
| 2020/0078482 A1 | 3/2020 | Yoon et al. |
| 2020/0078499 A1 | 3/2020 | Gadde et al. |
| 2020/0100711 A1 | 4/2020 | Choudhury et al. |
| 2020/0147407 A1 | 5/2020 | Efremkin |
| 2020/0281512 A1 | 9/2020 | Grubb et al. |
| 2020/0281513 A1 | 9/2020 | Grubb et al. |
| 2020/0281529 A1 | 9/2020 | Grubb et al. |
| 2020/0289346 A1 | 9/2020 | Hansen et al. |
| 2020/0330258 A1 | 10/2020 | Hansen et al. |
| 2020/0360547 A1 | 11/2020 | Smith et al. |
| 2021/0137446 A1 | 5/2021 | Brownhill et al. |
| 2021/0145359 A1 | 5/2021 | Hunt et al. |
| 2021/0212855 A1 | 7/2021 | Hansen et al. |
| 2022/0079509 A1 | 3/2022 | Gellman et al. |

FOREIGN PATENT DOCUMENTS

| | | | |
|---|---|---|---|
| CN | 105395184 A | 3/2016 | |
| CN | 106102322 A | 11/2016 | |
| CN | 109350362 A | 2/2019 | |
| DE | 102012211015 A1 | 1/2014 | |
| DE | 102013013013 A1 | 2/2015 | |
| EP | 2454990 A2 | 5/2012 | |
| EP | 2565630 A1 | 3/2013 | |
| EP | 1734858 B1 | 7/2014 | |
| EP | 3231478 A1 | 10/2017 | |
| EP | 3409190 A1 | 12/2018 | |
| EP | 3499510 A1 | 6/2019 | |
| EP | 3837520 A1 | 6/2021 | |
| EP | 4157178 A1 | 4/2023 | |
| GB | 1476894 A | 6/1977 | |
| GB | 2316171 A | 2/1998 | |
| GB | 2563602 A | 12/2018 | |
| JP | 2009225863 A | 10/2009 | |
| KR | 20120119523 A | 10/2012 | |
| KR | 101224629 B1 | 1/2013 | |
| KR | 20140024743 A | 3/2014 | |
| KR | 20140058041 A | 5/2014 | |
| KR | 20160071044 A | 6/2016 | |
| KR | 20190105898 A | 9/2019 | |
| NL | 1027236 C2 | 4/2006 | |
| WO | WO-0021433 A1 | 4/2000 | |
| WO | WO-0043046 A2 | 7/2000 | |
| WO | WO-03067229 A1 | 8/2003 | |
| WO | WO-2006041997 A2 | 4/2006 | |
| WO | WO-2007030379 A2 | 3/2007 | |
| WO | WO-2008006150 A1 | 1/2008 | |
| WO | WO-2008010604 A1 | 1/2008 | |
| WO | WO-2009052607 A1 | 4/2009 | |
| WO | WO-2009120951 A2 | 10/2009 | |
| WO | WO-2009141777 A1 | 11/2009 | |
| WO | WO-2010020919 A1 | 2/2010 | |
| WO | WO-2010105053 A2 | 9/2010 | |
| WO | WO-2011082420 A1 | 7/2011 | |
| WO | WO-2011113070 A1 | 9/2011 | |
| WO | WO-2011123848 A1 | 10/2011 | |
| WO | WO-2012141999 A1 | 10/2012 | |
| WO | WO-2013026999 A1 | 2/2013 | |
| WO | WO-2013044226 A2 | 3/2013 | |
| WO | WO-2014036577 A1 | 3/2014 | |
| WO | WO-2014116816 A1 | 7/2014 | |
| WO | WO-2015112095 A1 | 7/2015 | |
| WO | WO-2015168720 A1 | 11/2015 | |
| WO | WO-2016025438 A1 | 2/2016 | |
| WO | WO-2016030752 A1 | 3/2016 | |
| WO | WO-2016058032 A1 | 4/2016 | |
| WO | WO-2016073777 A1 | 5/2016 | |
| WO | WO-2016100218 A1 | 6/2016 | |
| WO | WO-2016110564 A1 | 7/2016 | |
| WO | WO-2016187136 A1 | 11/2016 | |
| WO | WO-2016205872 A1 | 12/2016 | |
| WO | WO-2016205881 A1 | 12/2016 | |
| WO | WO-2017021006 A1 | 2/2017 | |
| WO | WO-2017021965 A2 | 2/2017 | |
| WO | WO-2017033058 A1 | 3/2017 | |
| WO | WO-2017037479 A1 | 3/2017 | |
| WO | WO-2017041014 A1 | 3/2017 | |
| WO | WO-2017041385 A1 | 3/2017 | |
| WO | WO-2017041386 A1 | 3/2017 | |
| WO | WO-2017041387 A1 | 3/2017 | |
| WO | WO-2017119996 A1 | 7/2017 | |
| WO | WO-2017205728 A1 | 11/2017 | |
| WO | WO-2017214188 A1 | 12/2017 | |
| WO | WO-2018035612 A1 | 3/2018 | |
| WO | WO-2018060417 A1 | 4/2018 | |
| WO | WO-2018064569 A1 | 4/2018 | |
| WO | WO-2018115461 A1 | 6/2018 | |
| WO | WO-2018144938 A1 | 8/2018 | |
| WO | WO-2018144941 A1 | 8/2018 | |
| WO | WO-2018144943 A1 | 8/2018 | |
| WO | WO-2018144946 A1 | 8/2018 | |
| WO | WO-2018185138 A1 | 10/2018 | |
| WO | WO-2018209090 A1 | 11/2018 | |
| WO | WO-2018211458 A1 | 11/2018 | |
| WO | WO-2018234443 A1 | 12/2018 | |
| WO | WO-2019020550 A2 * | 1/2019 | ......... H01L 23/3185 |
| WO | WO-2019020551 A1 | 1/2019 | |
| WO | WO-2019020666 A1 | 1/2019 | |
| WO | WO-2019030384 A2 | 2/2019 | |
| WO | WO-2019048624 A1 | 3/2019 | |
| WO | WO-2019048626 A1 | 3/2019 | |
| WO | WO-2019048638 A1 | 3/2019 | |
| WO | WO-2019063481 A1 | 4/2019 | |
| WO | WO-2019063488 A2 | 4/2019 | |
| WO | WO-2019067264 A1 | 4/2019 | |
| WO | WO-2019072531 A1 | 4/2019 | |
| WO | WO-2019076967 A2 | 4/2019 | |
| WO | WO-2019096828 A1 | 5/2019 | |
| WO | WO-2019140441 A2 | 7/2019 | |
| WO | WO-2019140444 A1 | 7/2019 | |
| WO | WO-2019140448 A1 | 7/2019 | |
| WO | WO-2019140449 A1 | 7/2019 | |
| WO | WO-2019193141 A1 | 10/2019 | |
| WO | WO-2019216883 A1 | 11/2019 | |
| WO | WO-2019230183 A1 | 12/2019 | |
| WO | WO-2019238180 A1 | 12/2019 | |
| WO | WO-2019238181 A1 | 12/2019 | |
| WO | WO-2019238182 A1 | 12/2019 | |
| WO | WO-2019238195 A1 | 12/2019 | |
| WO | WO-2019238196 A1 | 12/2019 | |
| WO | WO-2019238197 A1 | 12/2019 | |
| WO | WO-2019238198 A1 | 12/2019 | |

(56) References Cited

FOREIGN PATENT DOCUMENTS

| WO | WO-2020002416 A1 | 1/2020 |
|---|---|---|
| WO | WO-2020043806 A1 | 3/2020 |
| WO | WO-2020139541 A1 | 7/2020 |
| WO | WO-2020157103 A1 | 8/2020 |
| WO | WO-2020159677 A1 | 8/2020 |
| WO | WO-2020167547 A1 | 8/2020 |
| WO | WO-2020242876 A1 | 12/2020 |
| WO | WO-2021059209 A1 | 4/2021 |
| WO | WO-2021250494 A1 | 12/2021 |

OTHER PUBLICATIONS

Aubakir B., et al., "Vital Sign Monitoring Utilizing Eulerian Video Magnification and Thermography," 38th Annual International Conference of the IEEE Engineering in Medicine and Biology Society, Aug. 16, 2016, pp. 3527-3530 (4 pages).

Bandodkar A.J., et al., "Battery-Free, Skin-Interfaced Microfluidic/Electronic Systems for Simultaneous Electrochemical, Colorimetric and Volumetric Analysis of Sweat," Science Advances, vol. 5 (1), Jan. 18, 2019, retrieved from http://advances.sciencemag.org/content/5/1/eaav3294, 16 pages.

Cauwe M., et al., "Technology Development for a Low-Cost, Roll-to-Roll Chip Embedding Solution Based on PET Foils," 18th European Microelectronics and Packaging Conference (EMPC), IEEE, Sep. 12, 2011, 6 pages.

Farooqui M.F., et al., "Low Cost Inkjet Printed Smart Bandage for Wireless Monitoring of Chronic Wounds," Scientific Reports, vol. 6, Jun. 29, 2016, 14 pages.

Geng Y., et al., "A Hybrid Low Power Biopatch for Body Surface Potential Measurement," IEEE Journal of Biomedical and Health Informatics, vol. 17, No. 3, May 1, 2013, pp. 591-599.

George J., et al., "Reliability of Plastic-Encapsulated Electronic Components in Supersaturated Steam Environments," IEEE Transactions on Components, Packaging and Manufacturing Technology, vol. 5 (10), Oct. 2015, pp. 1423-1431.

Iannetta Jr. R.A., et al., "Successful Case Histories of Polymer Based Circuitry on Flexible Film Substrates," Electro/94 International Conference Proceedings Combined vols. IEEE, XP010149465, May 10-12, 1994, pp. 885-889.

International Search Report and Written Opinion for Application No. PCT/EP2021/055436, mailed on Jun. 29, 2021, 19 pages.

Little Miss Plasters, kidstravelclub.co.uk., retrieved from http://www.kidstravelclub.co.uk/little-miss-girls-childrens-plasters on Aug. 26, 2016, 2 pages.

Lu B., et al., "A Study of the Autofluorescence of Parylene Materials for µTAS Applications," Lab on Chip, vol. 10 (14), Jul. 2010, pp. 1826-1834.

McLeod A.J., et al., "Motion Magnification for Endoscopic Surgery," Progress in Biomedical Optics and Imaging, SPIE—International Society for Optical Engineering, Mar. 12, 2014, vol. 9036, 8 pages.

Mehmood N., et al., "Applications Of Modern Sensors And Wireless Technology In Effective Wound Management: Modern Sensors And Wireless Technology," Journal of Biomedical Materials Research Part B, vol. 102, May 1, 2014, XP055739544, pp. 885-895.

Mostafalu P., et al., "Wireless Flexible Smart Bandage For Continuous Monitoring Of Wound Oxygenation," IEEE Transactions on Biomedical Circuits and Systems, vol. 9 (5), Oct. 1, 2015, XP055526132, pp. 670-677 (8 pages).

Narusawa H., "The Corona Discharge Causes Short Destruction that had Bad Influence on a Power Switching Circuit," Adphox Corporation, Jan. 1, 2009, retrieved from http://www.adphox.co.jp/keisokuki/ke-english-corona/CORONA_DISCHARGE_EN.pdf, 12 pages.

Pang Q., et al., "Smart Flexible Electronics-Integrated Wound Dressing for Real-Time Monitoring and On-Demand Treatment of Infected Wounds," Advanced Science, vol. 7, No. 6, Mar. 2020, 1902673, XP055739532, 10 pages.

Raviglione A., et al., "Real-Time Smart Textile-Based System to Monitor Pressure Offloading of Diabetic Foot Ulcers," Journal of Diabetes Science and Technology, vol. 11 (5), Sep. 2017, pp. 894-898.

Rose D.P., et al., "Adhesive RFID Sensor Patch for Monitoring of Sweat Electrolytes," IEEE Transactions on Biomedical Engineering, vol. 62 (6), Jun. 2015, first published on Nov. 11, 2015, pp. 1457-1465.

Simoska O., et al., "Electrochemical Detection of Multianalyte Biomarkers in Wound Healing Efficacy," ACS Sensors, Nov. 11, 2020, pp. 3547-3557.

"'Smart' Wearable Sensor Developed to Track Healing," retrieved from https://web.archive.org/web/20201203160955/https://www.theengineer.co.uk/smart-wearable-sensor-developed-to-track-healing/, Dec. 3, 2020, 2 pages.

Wakita J., et al., "Variations in Optical Absorption and Fluorescence Spectra for Polyimide Thin Films Caused by Structural Isomerism," Journal of Photopolymer Science and Technology, Jan. 1, 2003, 1 page.

Willis B., "Conformal Coating Inspection & Coating Faults," Vision Engineering, Jul. 21, 2016, retrieved from http://www.visioneng.com/wp-content/uploads/2017/11/Conformal-Coating-Inspection-and-Defects.21JUL16.pdf, 35 pages.

Willis B., "Guide to Conformal Coating & Cleaning Defects Contents," Mar. 1, 2014, retrieved from http://coatingguide.smartgroup.org/Files%20pdf/Coating%20Defects%20V2%2014March2014.pdf, vol. 1, 31 pages.

* cited by examiner

100B

SENSOR INTEGRATED DRESSINGS AND SYSTEMS

CROSS-REFERENCE TO RELATED APPLICATIONS

This application is a U.S. national stage application of International Patent Application No. PCT/EP2021/055436, filed Mar. 4, 2021, which claims priority to U.K. Provisional Application No. 2003203.3, filed Mar. 5, 2020, titled "SENSOR INTEGRATED DRESSINGS AND SYSTEMS," the entirety of which is hereby incorporated by reference.

BACKGROUND

Field

Embodiments of the present disclosure relate to apparatuses, systems, and methods for the monitoring and/or treatment of tissue with sensor integrated or sensor-enabled dressings.

Description of the Related Art

Nearly all areas of medicine may benefit from improved information regarding the state of the tissue, organ, or system to be treated, particularly if such information is gathered in real-time during treatment, many types of treatments are still routinely performed without the use of sensor data collection. Instead, such treatments rely upon visual inspection by a caregiver or other limited means rather than quantitative sensor data. For example, in the case of wound treatment via dressings and/or negative pressure wound therapy, data collection is generally limited to visual inspection by a caregiver and often the underlying wounded tissue may be obscured by bandages or other visual impediments. Even intact, unwounded skin may have underlying damage that is not visible to the naked eye, such as a compromised vascular or deeper tissue damage that may lead to an ulcer or injury. Similar to wound treatment, during orthopedic treatments requiring the immobilization of a limb with a cast or other encasement, only limited information is gathered on the underlying tissue. In instances of internal tissue repair, such as a bone plate, continued direct sensor-driven data collection is not performed. Further, braces and/or sleeves used to support musculoskeletal function do not monitor the functions of the underlying muscles or the movement of the limbs. Outside of direct treatments, common hospital room items such as beds and blankets could be improved by adding capability to monitor patient parameters.

Therefore, there is a need for improved sensor monitoring, particularly through the use of sensor integrated substrates which can be incorporated into existing treatment regimes.

SUMMARY

In some cases, a wound dressing and a method for coating a wound dressing is provided. A coating may be applied on a first side of a substantially flexible substrate of the wound dressing. The first side of the substrate may support a plurality of electronic components, electronic tracks, and a plurality of connectors between the electronic components and electronic tracks. The coating may be applied to the substrate, the electronic tracks, the at least one connector of the plurality of connectors, or to at least one electronic components of the plurality of electronic components to encapsulate the dressing and/or to reinforce the at least one connector or the at least one electronic components.

The wound dressing and/or method of any preceding paragraph and/or any of the wound dressing and/or methods disclosed herein may further comprise one or more of the following features. The coating can be a first coating applied to the at least one connector of the plurality of connectors or to at least one electronic components of the plurality of electronic components to reinforce the at least one connector or the at least one electronic components. A second coating may be applied on the first side of the substrate, wherein the second coating comprises a first layer and a second layer, wherein the first layer is applied in a first direction and a second coating is applied in a second direction that is transverse to the first direction. A second side of the substrate opposite the first side may be coated with a third coating.

The method of any preceding paragraphs and/or any of the methods disclosed herein can include one or more of the following features. The method can further comprise coating at least some of the plurality of the electronic components with a fourth coating. The method can further comprise a plurality of perforations formed through the second coating and the substrate, the plurality of perforations configured to facilitate passage of fluid. The third coating can comprise the same material as that of the second coating applied to the first side of the substrate. The third coating can comprise a different material from that of the second coating applied to the first side of the substrate. The plurality of electronic components can comprise a plurality of sensors configured to obtain measurements of the wound, at least some of the plurality of sensors interconnected by a plurality of electronic connections.

The wound dressing and/or method as described above may further comprise one or more of the following features. A second coating applied on the first side of the substrate, wherein the second coating can comprises a first layer and a second layer. The first layer can be applied in a first direction and the second layer can be applied in a second direction that is parallel to the first direction and the first layer can be offset from the second layer. A second side of the substrate opposite the first side can be coated with a third coating.

The method of any preceding paragraphs and/or any of the methods disclosed herein can include one or more of the following features. The method can further comprise coating at least some of the plurality of the electronic components with a fourth coating. The method can further comprise a plurality of perforations formed through the second coating and the substrate, the plurality of perforations configured to facilitate passage of fluid. The third coating can comprise the same material as that of the second coating applied to the first side of the substrate. The third coating can comprise a different material from that of the second coating applied to the first side of the substrate. The plurality of electronic components can comprise a plurality of sensors configured to obtain measurements of the wound, at least some of the plurality of sensors interconnected by a plurality of electronic connections.

In some cases, a method for coating a wound dressing can comprise applying a primer treatment layer to a first side of a substantially flexible substrate of the wound dressing.

The wound dressing and/or method as described above may further comprise one or more of the following features. A first coating can be applied over the primer treatment layer on the first side of the substantially flexible substrate of the wound dressing, the first side of the substrate supporting a plurality of electronic components, electronic tracks, and a plurality of connectors between the electronic components and electronic tracks, wherein the first coating is applied to at least one connector of the plurality of connectors or to at least one electronic components of the plurality of electronic components to reinforce the at least one connector or the at least one electronic components and applying a second coating on the first side of the substrate.

The method of any preceding paragraphs and/or any of the methods disclosed herein can include one or more of the following features. The method can further comprise coating a second side of the substrate opposite the first side with a third coating. The method can further comprise applying a second primer treatment layer to a second side of the substrate prior to applying the third coating. The first primer treatment layer or the second primer treatment layer can comprise parylene. The first primer treatment layer or the second primer treatment layer can comprise Parylene C. The method can further comprise coating at least some of the plurality of the electronic components with a fourth coating. The method can further comprise a plurality of perforations formed through the second coating and the substrate, the plurality of perforations configured to facilitate passage of fluid. The third coating can comprise the same material as that of the second coating applied to the first side of the substrate. The third coating can comprise a different material from that of the second coating applied to the first side of the substrate. The plurality of electronic components comprise a plurality of sensors configured to obtain measurements of the wound, at least some of the plurality of sensors interconnected by a plurality of electronic connections.

In some cases, a wound dressing apparatus can comprise a substantially flexible substrate comprising a first side of the substrate supporting a plurality of electronic components, electronic tracks, and a plurality of connectors between the electronic components and electronic tracks and a primer treatment layer on the first side of the substantially flexible substrate of the wound dressing.

The wound dressing and/or method as described above may further comprise one or more of the following features. A first coating on the first side of the substrate can be applied to the primer treatment layer and over regions of at least one connector of the plurality of connectors or to at least one electronic components of the plurality of electronic components to reinforce the at least one connector or the at least one electronic components. A second coating can be on the first side of the substrate, and a third coating can be on a second side of the substrate opposite the first side.

The wound dressing of any preceding paragraphs and/or any of the wound dressings disclosed herein can include one or more of the following features. The dressing can further comprise a second primer treatment layer applied to the second side of the substrate between the substrate and the third coating. The first primer treatment layer or the second primer treatment layer can comprises parylene.

The first primer treatment layer or the second primer treatment layer can comprise Parylene C. The dressing can further comprise at least some of the plurality of the electronic components coated with a fourth coating. The dressing can further comprise a plurality of perforations formed through the second coating and the substrate, the plurality of perforations configured to facilitate passage of fluid. The third coating can comprise the same material as that of the second coating on the first side of the substrate. The third coating can comprise a different material from that of the second coating on the first side of the substrate. The plurality of electronic components can comprise a plurality of sensors configured to obtain measurements of the wound, at least some of the plurality of sensors interconnected by a plurality of electronic connections.

In some cases, a wound dressing and/or method as described herein may further comprise a coating with varying thickness or uniform thickness.

In some cases, a wound dressing and/or method as described herein may further comprise a hydrophilic coating on the non-wound facing side of the substrate to draw fluid through the substrate.

In some cases, a wound dressing and/or method as described herein may further comprise a first non-stretchable coating with various shapes or profiles.

In some cases, a wound dressing and/or method as described herein may further comprise a first non-stretchable coating on a non-wound facing side of the substrate.

In some cases, a wound dressing and/or method as described herein may further comprise a silicone material to encapsulate the substrate.

In some cases, a wound dressing and/or method as described herein may further comprise an adhesive material to encapsulate the substrate.

In some cases, a wound dressing and/or method as described herein may further comprise an adhesive material to encapsulate the substrate.

In some cases, a wound dressing and/or method as described herein may further comprise applying the various coatings in any order.

In some cases, a wound dressing and/or method as described herein may further comprise some or all coatings comprising a flexible material but not a stretchable material.

In some cases, a wound dressing and/or method as described herein may further comprise some or all coatings comprising a stretchable material.

In some cases, a wound dressing and/or method as described herein may further comprise some or all coatings comprising the same material.

In some cases, a wound dressing and/or method as described herein may further comprise coatings that are optically clear, transparent, and/or colorless.

In some cases, a kit can include the dressing of any preceding paragraphs or any of the dressings disclosed herein and a negative pressure wound therapy device configured to supply negative pressure to the wound covered by the dressing.

The kit of any preceding paragraph and/or any of the kits disclosed herein can include one or more of the following features. The dressing and the negative pressure wound therapy device can be sterile. The kit can include a secondary dressing configured to be positioned over the dressing.

BRIEF DESCRIPTION OF THE DRAWINGS

Embodiments of the present disclosure will now be described hereinafter, by way of example only, with reference to the accompanying drawings in which.

DETAILED DESCRIPTION

Figure 1A:
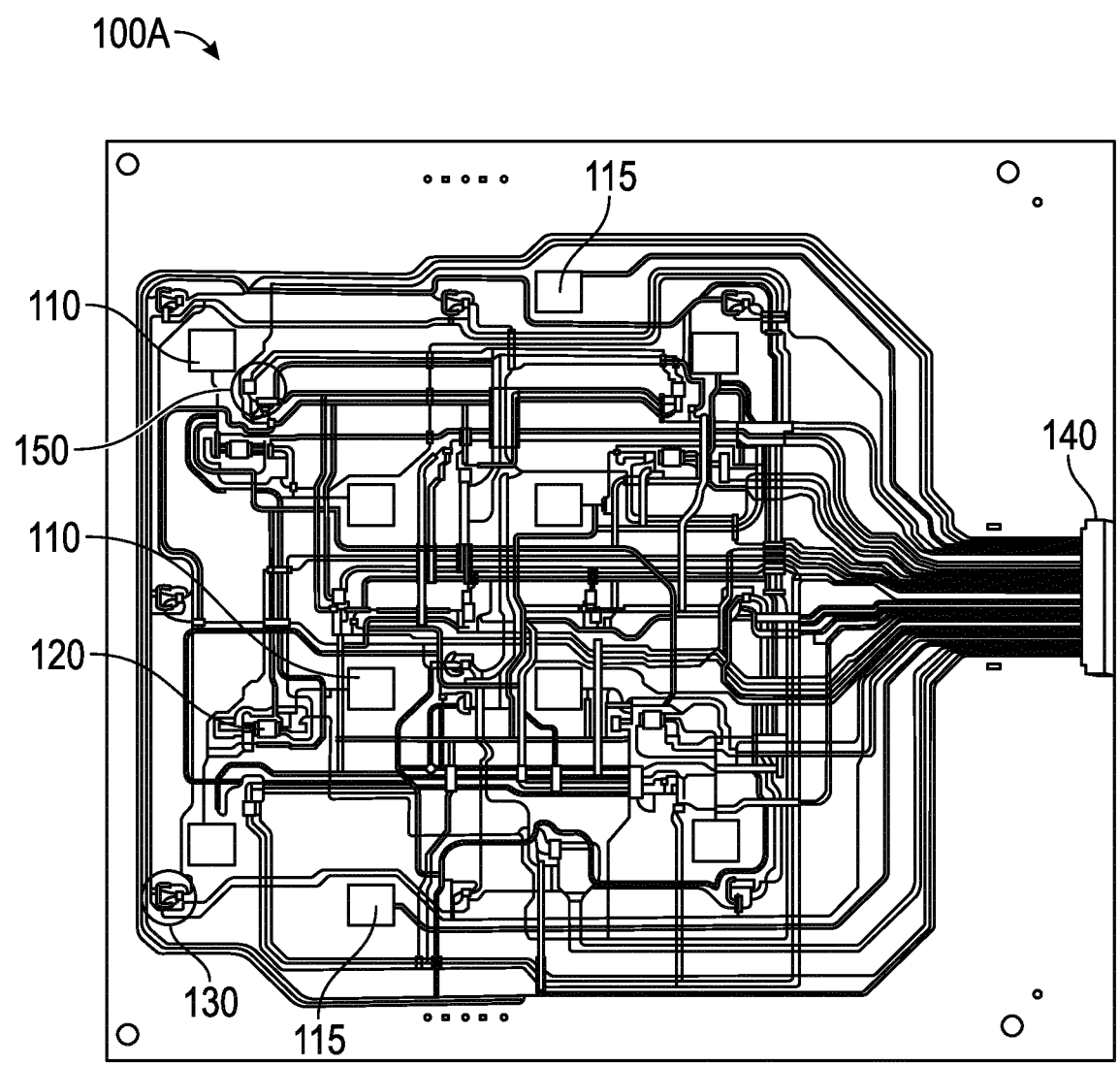
FIG. 1A illustrates a perspective view of a substrate supporting electronic components.

Embodiments disclosed herein relate to apparatuses and methods of at least one of monitoring or treating biological tissue with sensor-enabled substrates. The embodiments disclosed herein are not limited to treatment or monitoring of a particular type of tissue or injury, instead the sensor-enabled technologies disclosed herein are broadly applicable to any type of therapy that may benefit from sensor-enabled substrates. Some implementations utilize sensors and data collection relied upon by health care providers to make both diagnostic and patient management decisions.

Certain embodiments disclosed herein relate to the use of sensors mounted on or embedded within substrates configured to be used in the treatment of both intact and damaged human or animal tissue. Such sensors may collect information about the surrounding tissue and transmit such information to a computing device or a caregiver to be utilized in further treatment. In certain implementations, such sensors may be attached to the skin anywhere on the body, including areas for monitoring arthritis, temperature, or other areas that may be prone to problems and require monitoring. Sensors disclosed herein may also incorporate markers, such as radiopaque markers, to indicate the presence of the device, for example prior to performing an MRI or other technique.

The sensor embodiments disclosed herein may be used in combination with clothing. Non-limiting examples of clothing for use with embodiments of the sensors disclosed herein include shirts, pants, trousers, dresses, undergarments, outer-garments, gloves, shoes, hats, and other suitable garments. In certain embodiments, the sensor embodiments disclosed herein may be welded into or laminated into/onto the particular garments. The sensor embodiments may be printed directly onto the garment and/or embedded into the fabric. Breathable and printable materials such as microporous membranes may also be suitable.

Sensor embodiments disclosed herein may be incorporated into cushioning or bed padding, such as within a hospital bed, to monitor patient characteristics, such as any characteristic disclosed herein. In certain embodiments, a disposable film containing such sensors could be placed over the hospital bedding and removed/replaced as needed.

In some implementations, the sensor embodiments disclosed herein may incorporate energy harvesting, such that the sensor embodiments are self-sustaining. For example, energy may be harvested from thermal energy sources, kinetic energy sources, chemical gradients, or any suitable energy source.

The sensor embodiments disclosed herein may be utilized in rehabilitation devices and treatments, including sports medicine. For example, the sensor embodiments disclosed herein may be used in braces, sleeves, wraps, supports, and other suitable items. Similarly, the sensor embodiments disclosed herein may be incorporated into sporting equipment, such as helmets, sleeves, and/or pads. For example, such sensor embodiments may be incorporated into a protective helmet to monitor characteristics such as acceleration, which may be useful in concussion diagnosis.

The sensor embodiments disclosed herein may be used in coordination with surgical devices, for example, the NAVIO surgical system by Smith & Nephew Inc. In some implementations, the sensor embodiments disclosed herein may be in communication with such surgical devices to guide placement of the surgical devices. In some implementations, the sensor embodiments disclosed herein may monitor blood flow to or away from the potential surgical site or ensure that there is no blood flow to a surgical site. Further surgical data may be collected to aid in the prevention of scarring and monitor areas away from the impacted area.

To further aid in surgical techniques, the sensors disclosed herein may be incorporated into a surgical drape to provide information regarding tissue under the drape that may not be immediately visible to the naked eye. For example, a sensor embedded flexible drape may have sensors positioned advantageously to provide improved area-focused data collection. In certain implementations, the sensor embodiments disclosed herein may be incorporated into the border or interior of a drape to create fencing to limit/ control the surgical theater.

Sensor embodiments as disclosed herein may also be utilized for pre-surgical assessment. For example, such sensor embodiments may be used to collect information about a potential surgical site, such as by monitoring skin and the underlying tissues for a possible incision site. For example, perfusion levels or other suitable characteristics may be monitored at the surface of the skin and deeper in the tissue to assess whether an individual patient may be at risk for surgical complications. Sensor embodiments such as those disclosed herein may be used to evaluate the presence of microbial infection and provide an indication for the use of antimicrobials. Further, sensor embodiments disclosed herein may collect further information in deeper tissue, such as identifying pressure ulcer or pressure injury damage and/or the fatty tissue levels.

The sensor embodiments disclosed herein may be utilized in cardiovascular monitoring. For example, such sensor embodiments may be incorporated into a flexible cardiovascular monitor that may be placed against the skin to monitor characteristics of the cardiovascular system and communicate such information to another device and/or a caregiver. For example, such a device may monitor pulse rate, oxygenation of the blood, and/or electrical activity of the heart. Similarly, the sensor embodiments disclosed herein may be utilized for neurophysiological applications, such as monitoring electrical activity of neurons.

The sensor embodiments disclosed herein may be incorporated into implantable devices, such as implantable orthopedic implants, including flexible implants. Such sensor embodiments may be configured to collect information regarding the implant site and transmit this information to an external source. In some cases, an internal source may also provide power for such an implant.

The sensor embodiments disclosed herein may also be utilized for monitoring biochemical activity on the surface of the skin or below the surface of the skin, such as lactose buildup in muscle or sweat production on the surface of the skin. In some cases, other characteristics may be monitored, such as glucose concentration, urine concentration, tissue pressure, skin temperature, skin surface conductivity, skin surface resistivity, skin hydration, skin maceration, and/or skin ripping.

Sensor embodiments as disclosed herein may be incorporated into Ear, Nose, and Throat (ENT) applications. For example, such sensor embodiments may be utilized to monitor recovery from ENT-related surgery, such as wound monitoring within the sinus passage.

Sensor embodiments disclosed herein may encompass sensor printing technology with encapsulation, such as encapsulation with a polymer film. Such a film may be constructed using any polymer described herein, such as polyurethane. Encapsulation of the sensor embodiments may provide waterproofing of the electronics and protection from local tissue, local fluids, and other sources of potential damage.

In certain embodiments, the sensors disclosed herein may be incorporated into an organ protection layer. Such a sensor-embedded organ protection layer may both protect the organ of interest and confirm that the organ protection layer is in position and providing protection. Further, a sensor-embedded organ protection layer may be utilized to monitor the underlying organ, such as by monitoring blood flow, oxygenation, and other suitable markers of organ health. In some cases, a sensor-enabled organ protection layer may be used to monitor a transplanted organ, such as by monitoring the fat and muscle content of the organ. Further, sensor-enabled organ protection layers may be used to monitor an organ during and after transplant, such as during rehabilitation of the organ.

The sensor embodiments disclosed herein may be incorporated into treatments for wounds (disclosed in greater detail below) or in a variety of other applications. Non-limiting examples of additional applications for the sensor embodiments disclosed herein include: monitoring and treatment of intact skin, cardiovascular applications such as monitoring blood flow, orthopedic applications such as monitoring limb movement and bone repair, neurophysiological applications such as monitoring electrical impulses, and any other tissue, organ, system, or condition that may benefit from improved sensor-enabled monitoring.

Wound Therapy

Some systems and methods disclosed herein relate to wound therapy for a human or animal body. Therefore, any reference to a wound herein can refer to a wound on a human or animal body, and any reference to a body herein can refer to a human or animal body. The disclosed technology embodiments may relate to preventing or minimizing damage to physiological tissue or living tissue, or to the treatment of damaged tissue (for example, a wound as described herein) wound with or without reduced pressure, including for example a source of negative pressure and wound dressing components and apparatuses. The apparatuses and components comprising the wound overlay and packing materials or internal layers, if any, are sometimes collectively referred to herein as dressings. In some cases, the wound dressing can be provided to be utilized without reduced pressure.

As used herein the expression "wound" may include an injury to living tissue may be caused by a cut, blow, or other impact, typically one in which the skin is cut or broken. A wound may be a chronic or acute injury. Acute wounds occur as a result of surgery or trauma. They move through the stages of healing within a predicted timeframe. Chronic wounds typically begin as acute wounds. The acute wound can become a chronic wound when it does not follow the healing stages resulting in a lengthened recovery. It is believed that the transition from acute to chronic wound can be due to a patient being immuno-compromised.

Chronic wounds may include for example: venous ulcers (such as those that occur in the legs), which account for the majority of chronic wounds and mostly affect the elderly, diabetic ulcers (for example, foot or ankle ulcers), peripheral arterial disease, pressure ulcers, pressure injury, or epidermolysis bullosa (EB).

Examples of other wounds include, but are not limited to, abdominal wounds or other large or incisional wounds, either as a result of surgery, trauma, sterniotomies, fasciotomies, or other conditions, dehisced wounds, acute wounds, chronic wounds, subacute and dehisced wounds, traumatic wounds, flaps and skin grafts, lacerations, abrasions, contusions, burns, diabetic ulcers, pressure ulcers, pressure injury, stoma, surgical wounds, trauma and venous ulcers or the like.

Wounds may also include a deep tissue injury. Deep tissue injury is a term proposed by the National Pressure Ulcer Advisory Panel (NPUAP) to describe a unique form of pressure ulcers. These ulcers have been described by clinicians for many years with terms such as purple pressure ulcers, ulcers that are likely to deteriorate and bruises on bony prominences.

Wounds may also include a pressure injury. A pressure injury is localized damage to the skin and/or underlying soft tissue, usually over a bony prominence or related to a medical or other device. The injury can present as intact skin or an open ulcer and may be painful. The injury occurs as a result of intense and/or prolonged pressure or pressure in combination with shear. The tolerance of soft tissue for pressure and shear may also be affected by microclimate, nutrition, perfusion, comorbidities and condition of the soft tissue.

Wound may also include tissue at risk of becoming a wound as discussed herein. For example, tissue at risk may include tissue over a bony protuberance (at risk of deep tissue injury/insult) or pre-surgical tissue (for example, knee tissue) that may have the potential to be cut (for example, for joint replacement/surgical alteration/reconstruction).

Some systems and methods disclosed herein relate to methods of treating a wound with the technology disclosed herein in conjunction with one or more of the following: advanced footwear, turning a patient, offloading (such as, offloading diabetic foot ulcers), treatment of infection, systemix, antimicrobial, antibiotics, surgery, removal of tissue, affecting blood flow, physiotherapy, exercise, bathing, nutrition, hydration, nerve stimulation, ultrasound, electrostimulation, oxygen therapy, microwave therapy, active agents ozone, antibiotics, antimicrobials, or the like.

Alternatively or additionally, a wound may be treated using topical negative pressure (TNP) and/or traditional advanced wound care, which is not aided by the using of applied negative pressure (may also be referred to as non-negative pressure therapy).

Advanced wound care may include use of an absorbent dressing, an occlusive dressing, use of an antimicrobial and/or debriding agents in a wound dressing or adjunct, a pad (for example, a cushioning or compressive therapy, such as stockings or bandages), or the like.

In some cases, a wound dressing comprises one or more absorbent layer(s). The absorbent layer may be a foam or a superabsorbent.

In some cases, the disclosed technology may be used in conjunction with a non-negative pressure dressing. A non-negative pressure wound dressing suitable for providing protection at a wound site may comprise an absorbent layer for absorbing wound exudate and an obscuring element for at least partially obscuring a view of wound exudate absorbed by the absorbent layer in use. The obscuring element may be partially translucent. The obscuring element may be a masking layer.

In some cases, the non-negative pressure wound dressing as disclosed herein comprises the wound contact layer and the absorbent layer overlies the wound contact layer. The wound contact layer can carry an adhesive portion for forming a substantially fluid tight seal over the wound.

In some cases, the wound dressing as disclosed herein further comprises layer of a superabsorbent fiber, or a viscose fiber or a polyester fiber.

In some cases, the wound dressing as disclosed herein further comprises a backing layer. The backing layer may be a transparent or opaque film. Typically the backing layer comprises a polyurethane film (typically a transparent polyurethane film).

In some cases, the foam may be an open cell foam, or closed cell foam, typically an open cell foam. The foam can be hydrophilic.

The wound dressing may comprise a transmission layer and the layer can be foam. The transmission layer may be a polyurethane foam laminated to a polyurethane film.

The non-negative pressure wound dressing may be a compression bandage. Compression bandages are known for use in the treatment of oedema and other venous and lymphatic disorders, e.g., of the lower limbs. The compression bandage in some cases may comprise a bandage system comprising an inner skin facing layer and an elastic outer layer, the inner layer comprising a first ply of foam and a second ply of an absorbent nonwoven web, the inner layer and outer layer being sufficiently elongated so as to be capable of being wound about a patient's limb.

Negative Pressure Wound Therapy

In some cases, treatment of wounds can be performed using negative pressure wound therapy. It will be understood that embodiments of the present disclosure are generally applicable to use in TNP systems. Briefly, negative pressure wound therapy assists in the closure and healing of many forms of "hard to heal" wounds by reducing tissue oedema; encouraging blood flow and granular tissue formation; removing excess exudate and may reduce bacterial load (and thus infection risk). In addition, the therapy allows for less disturbance of a wound leading to more rapid healing. TNP therapy systems may also assist on the healing of surgically closed wounds by removing fluid and by helping to stabilize the tissue in the apposed position of closure. A further beneficial use of TNP therapy can be found in grafts and flaps where removal of excess fluid is important and close proximity of the graft to tissue is required in order to ensure tissue viability.

Negative pressure therapy can be used for the treatment of open or chronic wounds that are too large to spontaneously close or otherwise fail to heal by means of applying negative pressure to the site of the wound. Topical negative pressure (TNP) therapy or negative pressure wound therapy (NPWT) involves placing a cover that is impermeable or semipermeable to fluids over the wound, using various means to seal the cover to the tissue of the patient surrounding the wound, and connecting a source of negative pressure (such as a vacuum pump) to the cover in a manner so that negative pressure is created and maintained under the cover. It is believed that such negative pressures promote wound healing by facilitating the formation of granulation tissue at the wound site and assisting the body's normal inflammatory process while simultaneously removing excess fluid, which may contain adverse cytokines or bacteria.

Some of the dressings used in NPWT can include many different types of materials and layers, for example, gauze, pads, foam pads or multi-layer wound dressings. One example of a multi-layer wound dressing is the PICO dressing, available from Smith & Nephew, includes a wound contact layer and a superabsorbent layer beneath a backing layer to provide a canister-less system for treating a wound with NPWT. The wound dressing may be sealed to a suction port providing connection to a length of tubing, which may be used to pump fluid out of the dressing or to transmit negative pressure from a pump to the wound dressing. Additionally, RENASYS-F, RENASYS-G, RENASYS-AB, and RENASYS-F/AB, available from Smith & Nephew, are additional examples of NPWT wound dressings and systems. Another example of a multi-layer wound dressing is the ALLEVYN Life dressing, available from Smith & Nephew, which includes a moist wound environment dressing that is used to treat the wound without the use of negative pressure.

As is used herein, reduced or negative pressure levels, such as $-X$ mmHg, represent pressure levels relative to normal ambient atmospheric pressure, which can correspond to 760 mmHg (or 1 atm, 29.93 inHg, 101.325 kPa, 14.696 psi, etc.). Accordingly, a negative pressure value of $-X$ mmHg reflects absolute pressure that is X mmHg below 760 mmHg or, in other words, an absolute pressure of (760$-X$) mmHg. In addition, negative pressure that is "less" or "smaller" than X mmHg corresponds to pressure that is closer to atmospheric pressure (such as, $-40$ mmHg is less than $-60$ mmHg). Negative pressure that is "more" or "greater" than $-X$ mmHg corresponds to pressure that is further from atmospheric pressure (such as, $-80$ mmHg is more than $-60$ mmHg). In some cases, local ambient atmospheric pressure is used as a reference point, and such local atmospheric pressure may not necessarily be, for example, 760 mmHg.

In some cases of wound closure devices described herein, increased wound contraction can lead to increased tissue expansion in the surrounding wound tissue. This effect may be increased by varying the force applied to the tissue, for example by varying the negative pressure applied to the wound over time, possibly in conjunction with increased tensile forces applied to the wound via embodiments of the wound closure devices. In some cases, negative pressure may be varied over time for example using a sinusoidal wave, square wave, or in synchronization with one or more physiological indices (such as, heartbeat).

Any of the embodiments disclosed herein can be used in combination with any of the features disclosed in one or more of WO2010/061225, US2016/114074, US2006/0142560, and U.S. Pat. No. 5,703,225, which describe absorbent materials; WO2013/007973, which describes non-negative pressure wound dressings; GB1618298.2 (filed on 28 Oct. 2016), GB1621057.7 (filed on 12 Dec. 2016), and GB1709987.0 (filed on 22 Jun. 2017), which describe multi-layered wound dressings; EP2498829 and EP1718257, which describe wound dressings; WO2006/110527, U.S. Pat. No. 6,759,566, and US2002/0099318, which describe compression bandages; U.S. Pat. Nos. 8,235,955 and 7,753,894, which describe wound closure devices; WO2013/175306, WO2016/174048, US2015/0190286, US2011/0282309, and US2016/0339158, which describe negative pressure wound therapy dressings, wound dressing components, wound treatment apparatuses, and methods. The disclosure of each of these applications is hereby incorporated by reference in its entirety.

Substrate Supporting Sensors

A wound dressing that incorporates a number of electronic components, including one or more sensors, can be utilized in order to monitor characteristics of a wound. Collecting and analyzing data from a wound can provide useful insights towards determining whether a wound is on a healing trajectory, selecting proper therapy, determining whether the wound has healed, or the like.

Figure 1B:
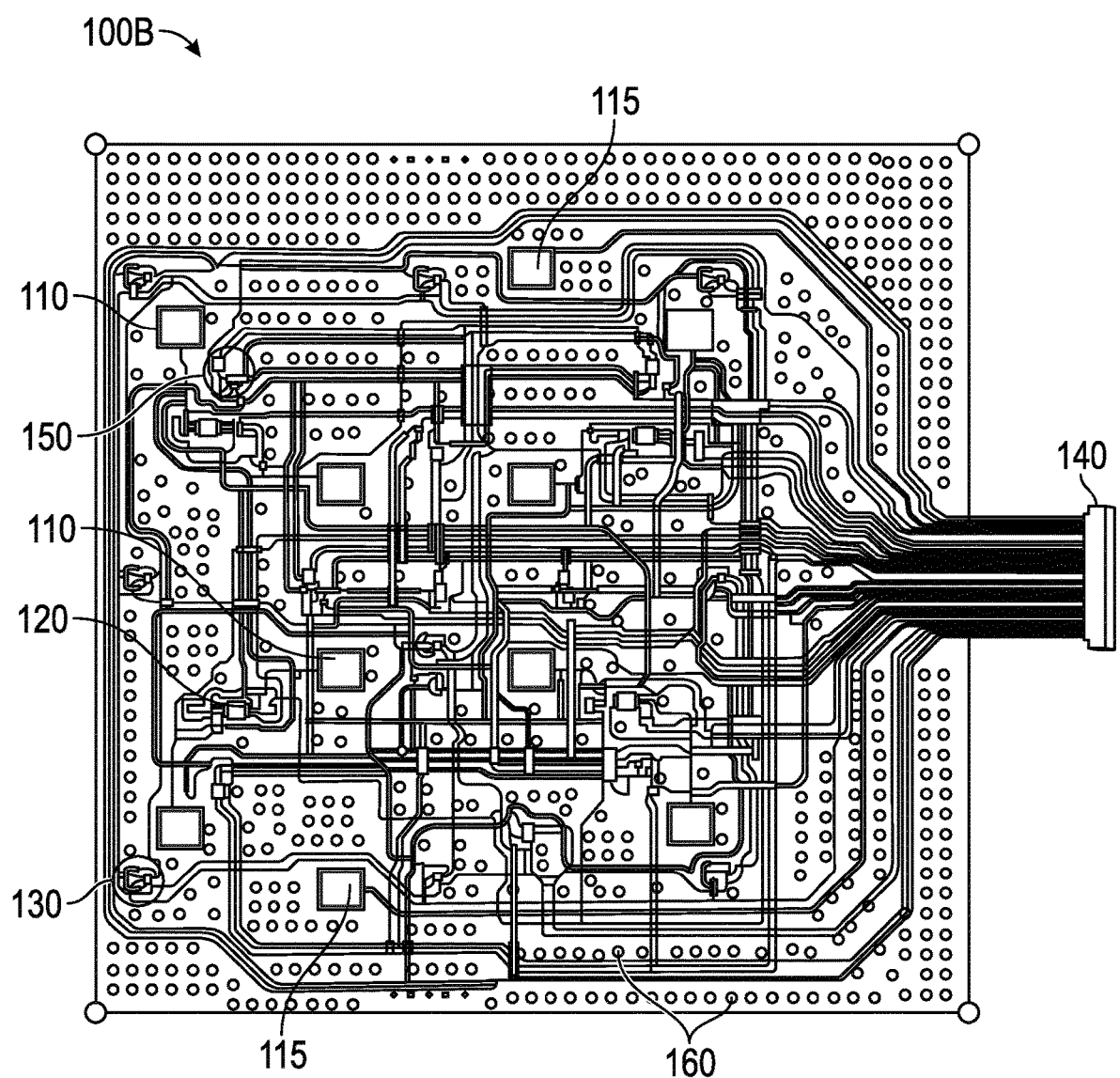
FIGS. 1B-1C illustrate perspective and top views of a perforated substrate supporting electronic components.
Figure 1C:
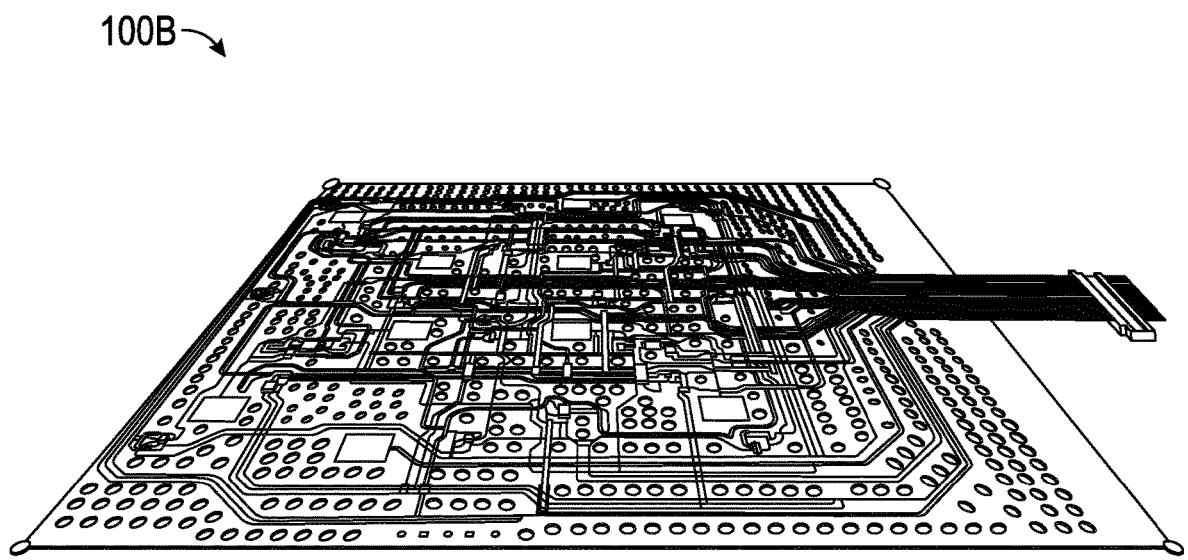

In some implementations, a number of sensor technologies can be used in wound dressings or one or more components forming part of an overall wound dressing apparatus. For example, as illustrated in FIGS. 1A-1C, one or more sensors can be incorporated onto or into a substrate (such substrate can be referred to as "sensor integrated substrate"). The substrate illustrated as having a square shape, but it will be appreciated that the substrate may have other shapes such as rectangular, circular, oval, etc. In some cases, a substrate supporting one or more sensors can be provided as an individual material layer that is placed directly or indirectly over or in a wound. The sensor integrated substrate can be part of a larger wound dressing apparatus. In some cases, the sensor integrated substrate is part of a single unit dressing. Additionally or alternatively, the sensor integrated substrate can be placed directly or indirectly over or in the wound and then covered by a secondary wound dressing, which can include one or more of gauze, foam or other wound packing material, a super-absorbent layer, a drape, a fully integrated dressing like the Pico or Allevyn Life dressing manufactured by Smith & Nephew, or the like.

The sensor integrated substrate can be placed in contact with a wound and can allow fluid to pass through the substrate while causing little to no damage to the tissue in the wound. The substrate can be flexible, elastic, extensible, or stretchable or substantially flexible, elastic, extensible, or stretchable in order to conform to or cover the wound. For example, the substrate can be made from a stretchable or substantially stretchable material, such as one or more of polyurethane, thermoplastic polyurethane (TPU), silicone, polycarbonate, polyethylene, polyimide, polyamide, polyester, polyethelene tetraphthalate (PET), polybutalene tetreaphthalate (PBT), polyethylene naphthalate (PEN), polyetherimide (PEI), along with various fluropolymers (FEP) and copolymers, or another suitable material.

In some cases, the substrate can include one or more flexible circuit boards, which can be formed of flexible polymers, including polyamide, polyimide (PI), polyester, polyethylene naphthalate (PEN), polyetherimide (PEI), along with various fluropolymers (FEP) and copolymers, or the like. One or more sensors can be incorporated into a two-layer flexible circuit. In some scenarios, the one or more circuit boards can be a multi-layer flexible circuit board.

In some cases, the sensor integrated substrate can incorporate adhesive, such as a wound contact layer as described herein, that adheres to wet or dry tissue. In some cases, one or more sensors, which can be positioned one or more flexible circuits, can be incorporated into any layer of the wound dressing. For example, a wound contact layer can have cutouts or slits that allow for one or more sensors to protrude out of the lower surface of the wound contact layer and contact the wound directly. In some situations, one or more sensors can be incorporated into or encapsulated within other components of a wound dressing, such as an absorbent layer.

As shown in FIG. 1A, a sensor integrated substrate 100A can support a plurality of electronic components and a plurality of electronic connections interconnecting at least some of the components. The electronic components can be one or more of any electronic components described herein, such as a sensor, amplifier, capacitor, resistor, inductor, controller, processor, or the like. The electronic connections can electrically connect one or more of the electronic components. The electronic connections can be tracks printed on the substrate, such as using copper, conductive ink (such as silver ink, graphite ink, etc.), or the like. At least some of the electronic connections can be flexible or stretchable or substantially flexible or stretchable.

The plurality of electronic components can include one or more impedance or conductivity sensors 110, which can be arranged in an outer 4×4 grid and an inner 4×4 grid as illustrated in FIGS. 1A-1C. Sensors 110 are illustrated as pads configured to measure impedance or conductivity of tissue across any pair of the pads. Two (or more) excitation pads 115 can be arranged as illustrated to provide the excitation signal across the pads, which is conducted by the tissue and responsive to which impedance or conductance of the tissue can be measured across the pads 110. Electrical components, such as one or more amplifiers 120, can be used to measure impedance or conductance of the tissue. Impedance or conductance measurements can be used to identify living and dead tissue, monitor progress of healing, or the like. The arrangement of the pads 110 in the inner and outer grids can be used to measure the impedance or conductance of the wound, perimeter of the wound, or tissue or areas surrounding the wound.

The plurality of electronic components can include one or more temperature sensors 130 configured to measure temperature of the wound or surrounding tissue. For example, nine temperature sensors arranged around the perimeter of the substrate 100A. One or more temperature sensors can include one or more thermocouples or thermistors. One or more temperature sensors can be calibrated and the data obtained from the one or more sensors can be processed to provide information about the wound environment. In some cases, an ambient sensor measuring ambient air temperature can also be used to assist in eliminating problems associated with environment temperature shifts.

The plurality of electronic components can include one or more optical sensors 150. One or more optical sensors 150 can be configured to measure wound appearance or image the wound. In some cases, a light source or illumination source that emits light and a light sensor or detector that detects light reflected by the wound are used as one or more optical sensors. The light source can be a light emitting diode (LED), such as one or more of white LED, red, green, blue (RGB) LED, ultraviolet (UV) LED, or the like. The light sensor can be one or more of an RGB sensor configured to detect color, infrared (IR) color sensor, UV sensor, or the like. In some cases, both the light source and detector would be pressed up against the skin, such that light would penetrate into the tissue and take on the spectral features of the tissue itself. In some scenarios, one or more optical sensor can include an imaging device, such as a charge-coupled device (CCD), CMOS image sensor, or the like.

In some cases, ultra bright LEDs, an RGB sensor, and polyester optical filters can be used as components of the one or more optical sensors to measure through tissue color differentiation. For example, because surface color can be measured from reflected light, a color can be measured from light which has passed through the tissue first for a given geometry. This can include color sensing from diffuse scattered light, from an LED in contact with the skin, or the like. In some cases, an LED can be used with a proximal RGB sensor to detect the light which has diffused through the tissue. The optical sensors can image with diffuse internal light or surface reflected light.

One or more of the plurality of electronic components can be controlled by a control module. The control module can receive and process one or more measurements obtained by the one or more sensors. An external control module can be connected to at least some of the plurality of electronic components via a connector 140. In some cases, the connector 140 can be positioned at the end of a conductive track portion as illustrated in FIG. 1B or attached to the conductive track portion at a position away from the end as illustrated in FIG. 1A or 1C (such as, attached to the top of the track portion with glue). The control module can include one or more controllers or microprocessors, memory, or the like. In some cases, one or more controllers can be positioned on the substrate, and the connector 140 is not used. In some cases, data and commands can be communicated wirelessly, such as by a transceiver positioned on the substrate, and the connector 140 is not used.

In some cases, additional or alternative sensors can be positioned on the substrate, such as one or more pH sensors, pressure sensors, perfusion sensors, or the like.

In some cases, a substrate can be perforated as illustrated in FIGS. 1B-1C. A plurality of perforations 160 can be formed in the substrate 100B, allowing fluid to pass through the substrate. It may be advantageous to use a perforated substrate in conjunction with application of negative pressure wound therapy, during which reduced pressure is applied to the wound covered by a dressing and which causes removal of fluid (such as wound exudate) from the wound. Perforations 160 can be formed around a plurality of electronic components and connections as illustrated in FIGS. 1B-1C. Perforations 160 can be formed as slits or holes. In some cases, perforations 160 can be small enough to help prevent tissue ingrowth while allowing fluid to pass through the substrate.

In some cases, any of the wound dressings or wound dressing components described herein can be part of a kit that also includes a negative pressure wound therapy device. One or more components of the kit, such as the sensor integrated substrate, secondary dressing, or the negative pressure wound therapy device can be sterile.

Any of the embodiments disclosed herein can be used with any of the embodiments described in International Patent Publication No. WO2017/195038, titled "SENSOR ENABLED WOUND MONITORING AND THERAPY APPARATUS," International Patent Publication No. WO2018/189265, titled "COMPONENT STRESS RELIEF FOR SENSOR ENABLED NEGATIVE PRESSURE WOUND THERAPY DRESSINGS," International Patent Application No. PCT/EP2018/069886, titled "SKEWING PADS FOR IMPEDANCE MEASUREMENT," and International Patent Application No. PCT/EP2018/075815, titled "SENSOR POSITIONING AND OPTICAL SENSING FOR SENSOR ENABLED WOUND THERAPY DRESSINGS AND SYSTEMS," each of which is incorporated by reference in its entirety.

Encapsulation and Stress Relief

In some cases, while it may be desirable for a substrate to be stretchable or substantially stretchable to better conform to or cover the wound, at least some of the electronic components or connections may not be stretchable or flexible. In such instances, undesirable or excessive localized strain or stress may be exerted on the one or more electronic components, such as on the supporting area or mountings of an electronic component, when the substrate is positioned in or over the wound. For example, such stress can be due to patient movement, changes in the shape or size of the wound (such as, due to its healing), or the like. Such stress may cause movement, dislodgment, or malfunction of the one or more electronic components or connections (for example, creation of an open circuit from a pin or another connector becoming disconnected). Alternatively or additionally, it may be desirable to maintain the position of one or more electronic components, such as one or more sensors, in the same or substantially same location or region with respect to the wound (such as, in contact with the wound) so that measurements collected by the one or more electronic components accurately capture changes over time in the same or substantially same location or region of the wound. While the surface of the stretchable substrate may move when, for example, the patient moves, it may be desirable to maintain same or substantially same locations of one or more electronic components relative to the wound.

To address these problems, in some cases, non-stretchable or substantially non-stretchable coating (such coating can sometimes be referred to as "hard coat") can be applied to one or more electronic components, one or more electronic connections, or the like. Hard coat can provide one or more of reinforcement or stress relief for one or more electronic components, one or more electronic connections, or the like. Hard coating can be formed from acrylated or modified urethane material. For example, hard coat can be one or more of Dymax 1901-M, Dymax 9001-E, Dymax 20351, Dymax 20558, Henkel Loctite 3211, or another suitable material. Hard coat can have viscosity from about 13,500 cP to 50,000 cP before being cured or from about 3,600 cP to about 6,600 cP before being cured. In some cases, hard coat can have viscosity of no more than about 50,000 cP. Hard coat can have hardness from about D40 to about D65 and/or linear shrinkage of about 1.5-2.5%.

In some cases, another coating (or coatings) can be applied to encapsulate or coat one or more of the substrate or components supported by the substrate, such as the electronic connections or the electronic components. Coating can provide biocompatibility, shield or protect the electronics from coming into contact with fluids, provide padding for the electronic components to increase patient comfort, or the like. As used herein, biocompatible can mean being in compliance with one or more applicable standards, such as ISO 10993 or USP Class VI. Such coating can be sometimes referred to as "conformal coat" or "soft coat." Soft coat can be stretchable or substantially stretchable. Soft coat can be hydrophobic or substantially hydrophobic.

Soft coat can be formed from one or more suitable polymers, adhesives, such as 1072-M adhesive (for example, Dymax 1072-M), 1165-M adhesive (such as, Dymax 1165-M), Dymax 1-20771, parylene (such as, Parylene C), silicones, epoxies, urethanes, acrylated urethanes, acrylated urethane alternatives (such as, Henkel Loctite 3381), or other suitable biocompatible and substantially stretchable materials. Soft coat can be thin coating, for example, from about 80 microns or less up to several millimeters or more. Soft coat can have hardness lower than about A100, A80, A50 or lower. Soft coat can have elongation at break higher than about 100%, 200%, 300% or more. Soft coat can have viscosity of about 8,000-14,500 centipoise (cP). In some cases, coating can have viscosity no less than about 3,000 cP. In some cases, coating can have viscosity less than about 3,000 cP.

Any of the hard or soft coats described herein can be applied by one or more of laminating, adhering, welding (for instance, ultrasonic welding), curing by one or more of light, UV, thermal (such as, heat), or the like. Any of the hard or soft coat described herein can be transparent or substantially transparent to facilitate optical sensing. Any of the coatings described herein can retain bond strength when subjected to sterilization, such as EtO sterilization. Any of the coatings described herein can be modified to fluoresce, such as under UV light.

Figure 2A:
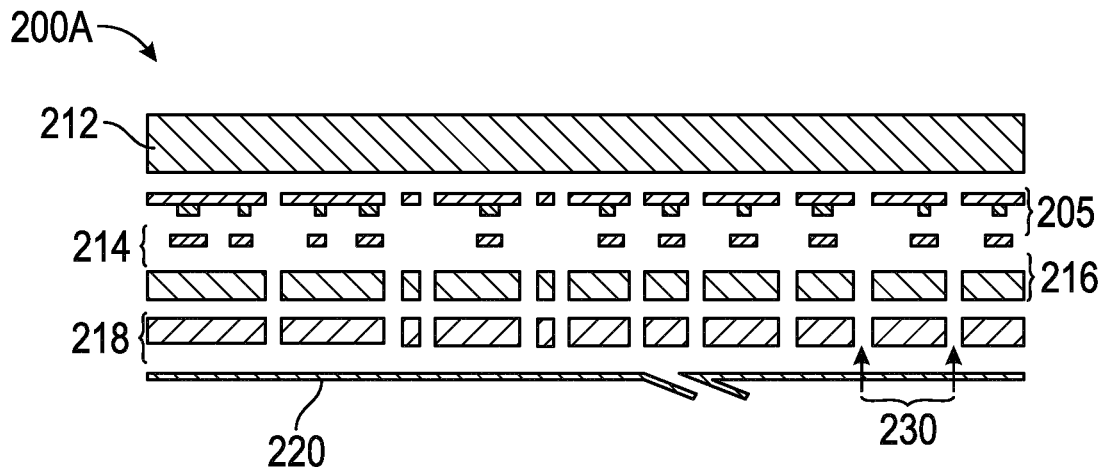
FIGS. 2A-2D illustrates cross-sections of wound dressings.
Figure 2B:
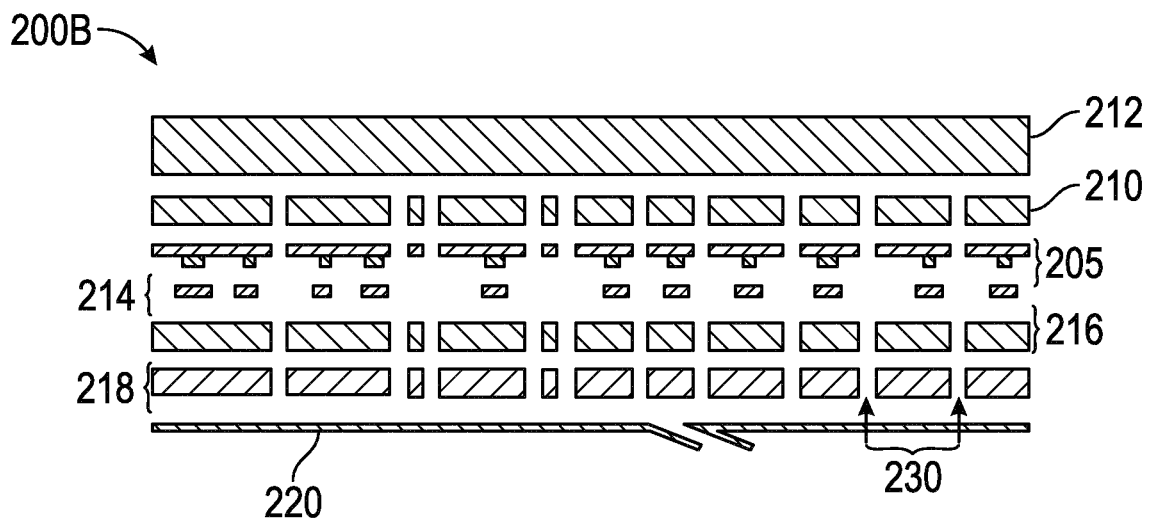

FIGS. 2A-2B illustrate cross-sections of wound dressings that include sensor integrated substrates. Dressing 200A shown in FIG. 2A can include a sensor integrated substrate 205 supporting a plurality of electronic components (shown as protruding from the substrate) and a plurality of electronic connections, as described herein. The dressing 200A can include hard coat 214, applied to one or more electronic components or connections. In some cases, hard coat can be applied to areas where electronic components are connected to electronic connections. This can reinforce these connections. In some cases, hard coat can be applied to each of the one or more of the electronic components or connections.

The dressing 200A can include soft coat 216, which can be applied to the entire wound facing side of the substrate. Soft coat 216 can be applied to an entire or substantially entire area of the wound facing side of the substrate to encapsulate the substrate, electronic components, and connections. In some cases, soft coat 216 can be applied to certain regions of the substrate, such as those regions supporting one or more of electronic components or connections.

The dressing 200A can include a wound contact layer 218. The wound contact layer 218 can include adhesive material configured to adhere the substrate to the wound, which can facilitate maintaining contact of one or more sensors with the wound. The wound contact layer 218 can be formed from silicone. The silicone material can be low tac (or tack) silicone. The wound contact layer 218 can include silicone adhesive mounted on a film. In some cases, the wound contact layer 218 can be similar to the material used in Allevyn Life Non-Bordered dressing manufactured by Smith & Nephew.

The wound contact layer 218 can be applied to entire or substantially entire area of the wound facing side of the substrate. In some cases, the wound contact layer 218 can be applied to certain regions of the substrate, such as those regions supporting one or more of electronic components or connections.

As illustrated in FIG. 2A, a plurality of perforations 230 can be formed through one or more of the substrate, hard coat, soft coat, and wound contact layer. As described herein, perforations can be made in regions or areas of the substrate that do not support electronic components or connections.

The dressing 200A can include a protective layer 220 applied to the wound contact layer 218. The protective layer 220 can be made of paper, such as laminated paper. The protective layer 220 can protect the wound contact layer 218 prior to use and facilitate easy application for a user. The protective layer 218 can include a plurality (such as two) handles. The handles can be applied in a folded configuration, in which a slit separating the handles is covered by one of handles folded over the slit. In some cases, the protective layer 218 can be similar to the protective layer used in the Allevyn Life Non-Bordered dressing.

As illustrated, a wicking layer 212 can be positioned over an opposite, non-wound facing side of the substrate. The wicking layer 212 can facilitate passage of fluid through the layers below the wicking layer. For example, the wicking layer can transport (or "wick") fluid away from the lower layers, such as from the substrate, toward one or more upper layers positioned over the wicking layer 212. Such one or more upper layers can include one or more absorbent materials as described herein. In some cases, the wicking layer 212 is formed from foam, such as foam similar to that used in the Allevyn Life Non-Bordered dressing. The wicking layer can be extensible or substantially extensible.

As illustrated in the dressing 200B of FIG. 2B, additional layer of soft coat 210 can be positioned over the non-wound facing side of the substrate between the substrate and the wicking layer 212. For example, soft coat 210 can protect the non-wound facing side of the substrate from fluid if the substrate is formed from material that is not impermeable to fluid. In such case, soft coat 210 can be hydrophobic or substantially hydrophobic. Soft coat 210 can be made of same or different material than soft coat 218. Soft coat 210 can be perforated as illustrated and described. In some cases, soft coat can encapsulate the entire substrate, including both the wound facing and non-wound facing sides.

Figure 2C:
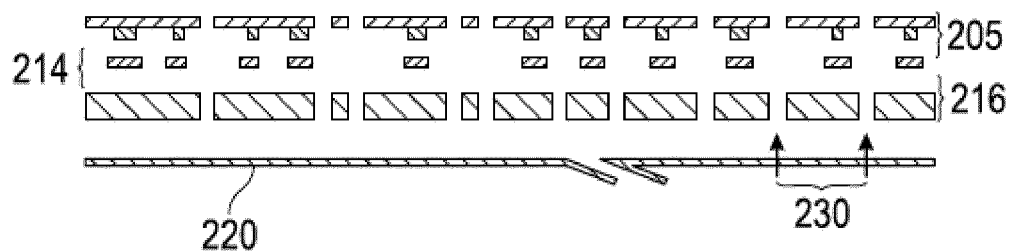
Figure 2D:
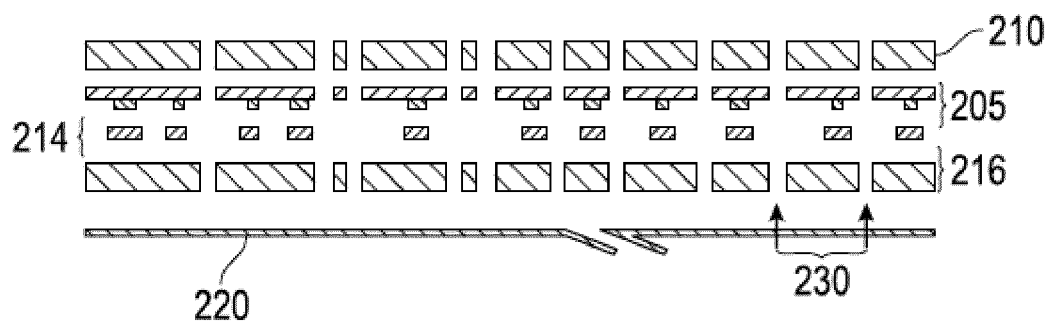

FIGS. 2C-2D illustrate cross-sections of wound dressings that include sensor integrated substrates similar to the wound dressings described with reference to FIGS. 2A-2B. However, the dressings illustrated in FIGS. 2C-2D do not utilize a wound contact layer or wicking layer. Dressing 200C shown in FIG. 2C can include a sensor integrated substrate 205 supporting a plurality of electronic components (shown as protruding from the substrate) and a plurality of electronic connections, as described herein. The dressing 200C can include hard coat 214, applied to one or more electronic components or connections. In some cases, hard coat can be applied to areas where electronic components are connected to electronic connections. This can reinforce these connections. In some cases, hard coat can be applied to each of the one or more of the electronic components or connections.

The dressing 200C can include soft coat 216, which can be applied to the entire wound facing side of the substrate. Soft coat 216 can be applied to an entire or substantially entire area of the wound facing side of the substrate to encapsulate the substrate, electronic components, and connections. In some cases, soft coat 216 can be applied to certain regions of the substrate, such as those regions supporting one or more of electronic components or connections.

As illustrated in FIG. 2C, a plurality of perforations 230 can be formed through one or more of the substrate, hard coat, and/or soft coat. As described herein, perforations can be made in regions or areas of the substrate that do not support electronic components or connections.

The dressing 200C can include a protective layer 220 applied to the substrate similar to the protective layer 220 described with reference to FIGS. 2A-2B.

As illustrated in the dressing 200D of FIG. 2D, additional layer of soft coat 210 can be positioned over the non-wound facing side of the substrate. For example, soft coat 210 can protect the non-wound facing side of the substrate from fluid if the substrate is formed from material that is not impermeable to fluid. In such case, soft coat 210 can be hydrophobic or substantially hydrophobic. Soft coat 210 can be made of the same or different material than soft coat 218.

Soft coat 210 can be perforated as illustrated and described. In some cases, soft coat can encapsulate the entire substrate, including both the wound facing and non-wound facing sides.

Figure 3A:
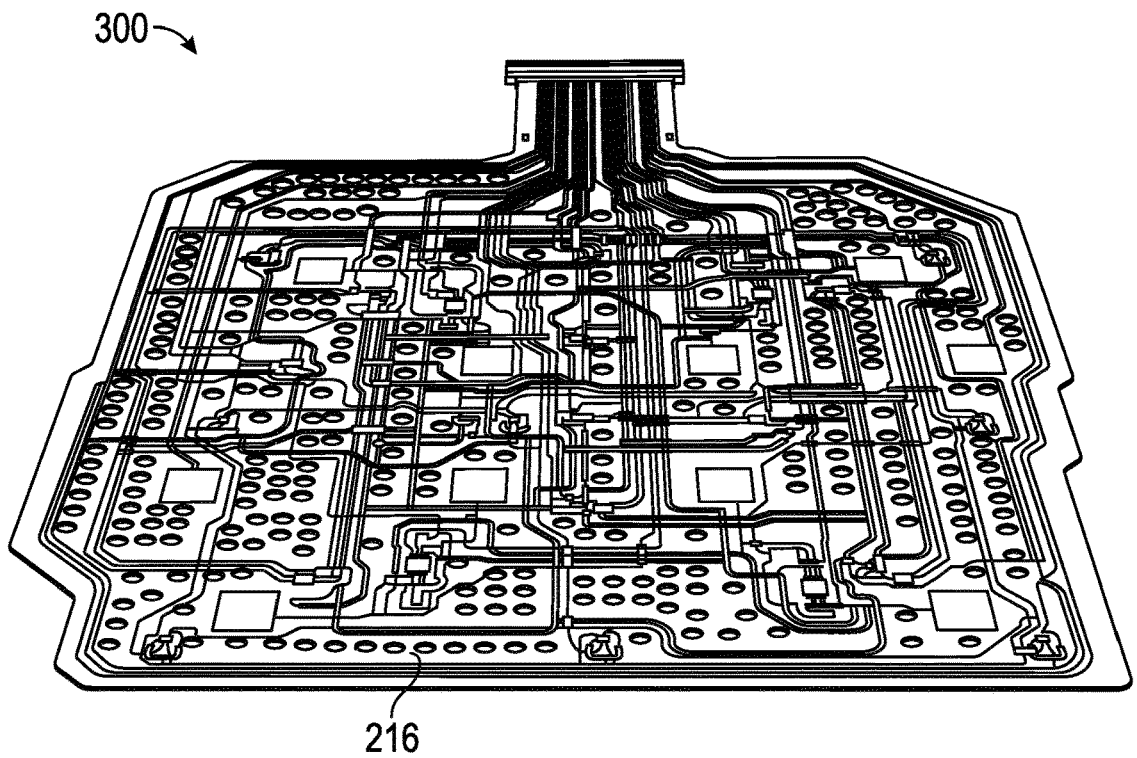
FIGS. 3A-3B illustrate perspective and top views of a perforated substrate supporting electronic components.
Figure 3B:
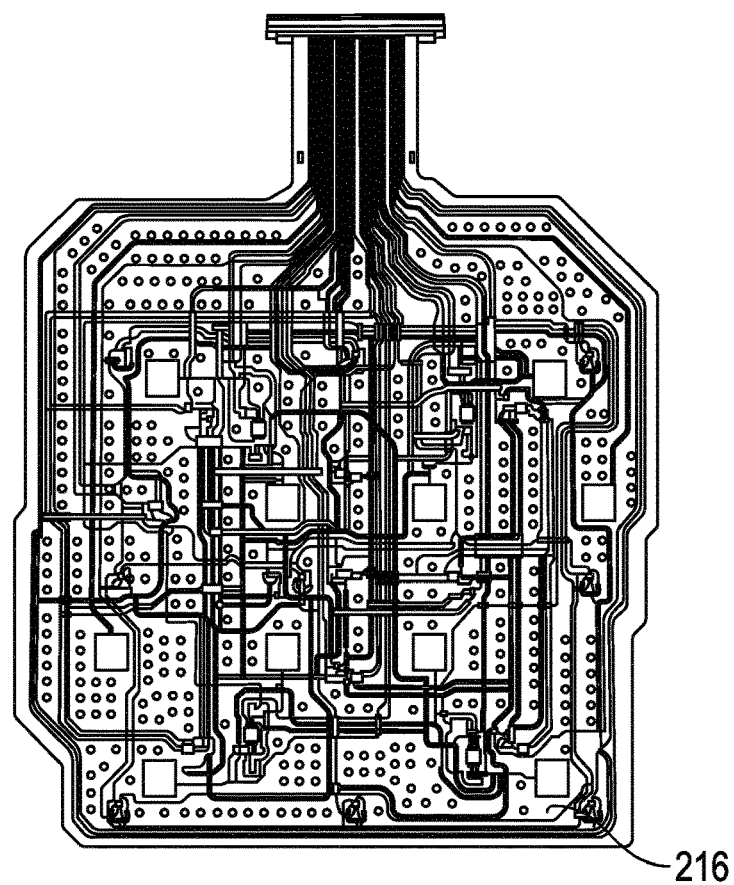

FIGS. 3A-3B illustrate coated sensor integrated substrates 300. The substrates 300 are illustrated with non-wound facing side 216 up. The substrates 300 can be similar to any of the substrates described herein.

Any of the embodiments disclosed herein can be used with any of the embodiments described in International Patent Application No. PCT/EP2018/069883, titled "BIO-COMPATIBLE ENCAPSULATION AND COMPONENT STRESS RELIEF FOR SENSOR ENABLED NEGATIVE PRESSURE WOUND THERAPY DRESSINGS," and International Patent Application No. PCT/EP2019/073026, titled "COMPONENT POSITIONING AND ENCAPSULATION FOR SENSOR ENABLED WOUND DRESSINGS," both of which are incorporated by reference in their entireties.

Coating of Substrate

The substrate with electronics can be coated on one or both sides of the substrate to provide support, stress relief, biocompatibility, and/or protection of the components on the substrate. The coating can be applied in various combinations to achieve one or more of these goals.

Figure 4:
FIG. 4 illustrates views of a wound dressings with gaps in the coating.

In some cases, the application pattern or material of the coating can cause gaps to be present in the coating. In some cases, these gaps can appear in certain areas of the substrate where certain features are present. For example, in some cases gaps can appear over the electronic tracks, electronic connections, and/or electronic components of the substrate. This can be a function of the different surface conditions between the substrate and the components (such as the silver track sections), causing the liquid coating to migrate off of the components or tracks leaving a gap during the liquid phase of the material after application. Examples of these gaps are illustrated in FIG. 4.

The surface of the substrate with electronic components and tracks can be treated with a material prior to the application of the coating. The treatment can be a liquid adhesive primer which can be applied to a portion of or the whole surface of the substrate. This primer treatment can help the coating be applied to and/or better adhere to the surface of the substrate (for example, the track sections). In some cases, the primer treatment can reduce the differential between the substrate and the electronic components, electronic connection, and/or electronic tracks in terms of surface energy. In some cases, a hard coat and/or soft coat can be applied over the primer treatment on the substrate, electronic components, electronic connection, and/or electronic tracks. The primer treatment layer can be applied with various thickness of the layer. The primer treatment layer can be applied as thin as 3 microns (about 3 microns). The primer treatment layer can be applied with a 1 to 10 microns (about 1 to 10 microns) of thickness. In some cases, the primer treatment layer can be between 1 to 600 µm (about 1 to 600 µm) of thickness. The primer treatment layer can be between 1 to 500 µm (about 1 to 500 µm), between 1 to 200 µm (about 1 to 200 µm), between 1 to 130 µm (about 1 to 130 µm) or between 1 to 10 µm (about 1 to 10 µm) of thickness.

Various materials can be used as the primer treatment on the substrate. For example, in some cases, a parylene coating can be used prior to application of the one or more hard coats or soft coats. The substrate can be placed in a vapor deposition process adding a thin layer of parylene to the sensor sheet prior to coating with one or more hard coats or soft coats. The one or more hard coats or soft coats can be applied over the top of the parylene layer and cured. In some cases, the parylene layer can comprise Parlyene C. The parylene coating can be applied with various layers of thickness. The parylene layer can be applied as thin as 3 microns of thickness. The parylene layer can be applied with a 1 to 10 microns of thickness. In some cases, the primer treatment layer can be between 1 to 600 µm (about 1 to 600 µm) thick. The primer treatment layer can be between 1 to 500 µm (about 1 to 500 µm), between 1 to 200 µm (about 1 to 200 µm), between 1 to 130 µm (about 1 to 130 µm), or between 1 to 10 µm (about 1 to 10 µm) thick.

In some cases, the parylene layer can reduce the differential in surface conditions between the substrate and the electronic components, electronic connection, and/or electronic tracks.

Figure 5:
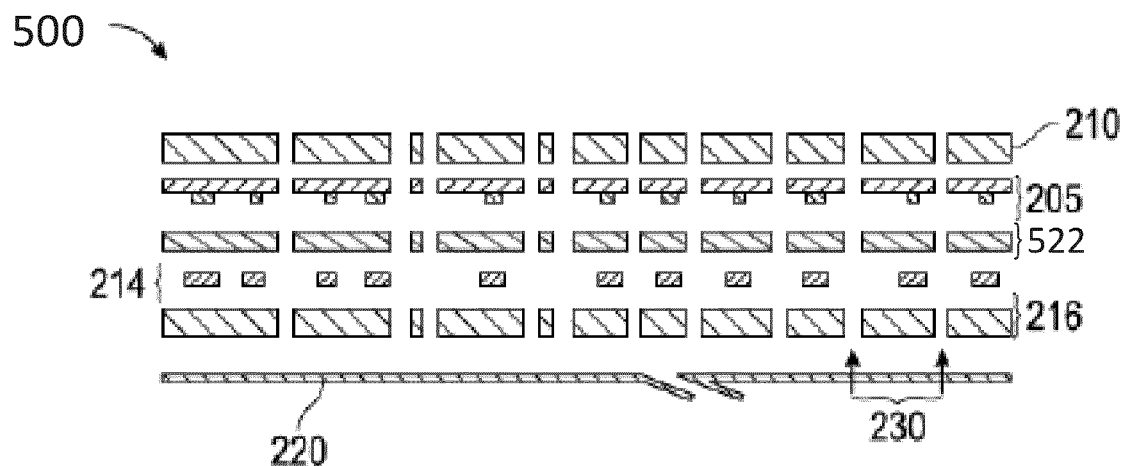
FIG. 5 illustrates a cross-section of a wound dressing.

FIG. 5 illustrates a dressing 500 with coatings similar to the substrates described in FIGS. 2A-2D. However, the dressing 500 can include a primer treatment layer 522. As illustrated in the dressing 500 of FIG. 5, a layer of primer treatment 522 can be positioned over the wound facing side of the substrate between the substrate 205 and the hard coat 214 and/or soft coat 216. In some cases, the hard coat 214 can be optional and the soft coat 216 can be applied directly over the primer treatment layer 522 positioned over a portion of or the entirety of the wound facing side of the substrate. In some cases, the primer treatment layer can be applied to one or both of the wound facing side or non-wound facing side of the substrate.

The application of the coating to the substrate can leave gaps due to the features. For example, when the coating is applied different heights of the electronic components, electronic connection, and/or electronic tracks on the substrate can leave gaps in the coating application. Additionally, due to the liquid phase of the coating, the coating can have valleys and peaks creating differing depths in the coating thickness. In some cases, the thickness of the coating can be increased to mitigate the potential for gaps to form. Alternatively or in addition, multiple passes of the coating application at reduced thickness can be used to achieve the same end thickness. For example, the coating can be applied in two or more passes. In some cases, the coating can be applied in two or more passes at 65 microns each to achieve a 130 micron coat thickness.

Figures 6A, 6B:
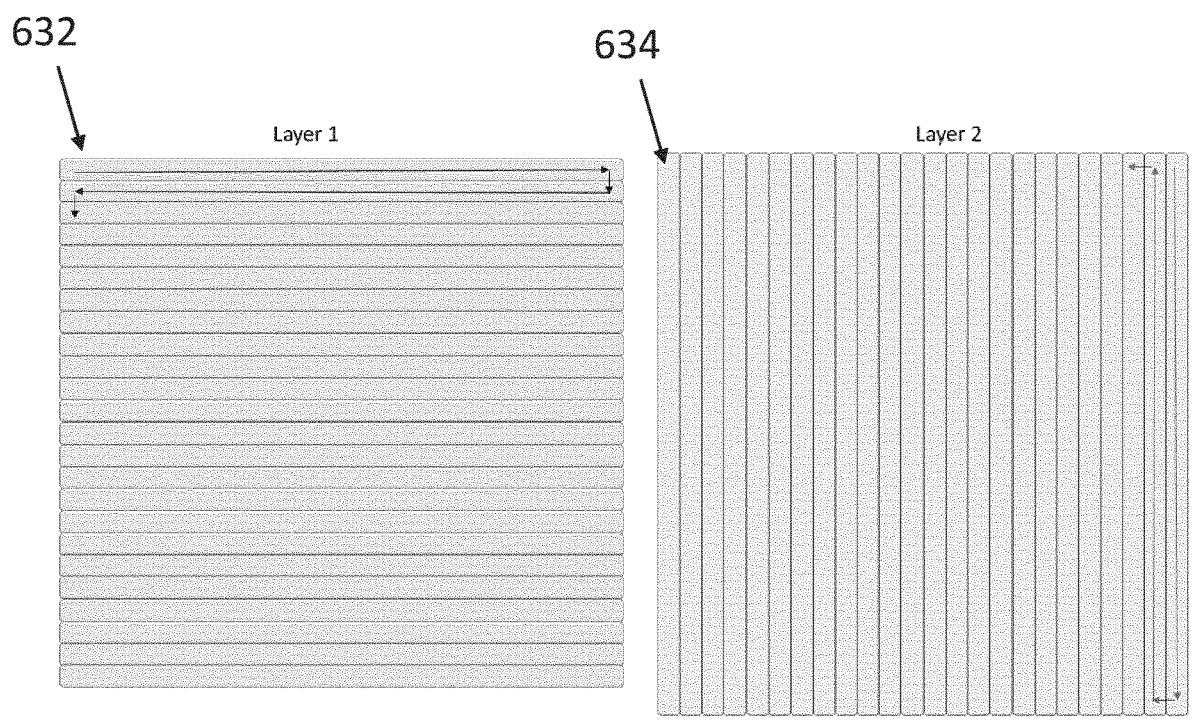
FIGS. 6A-6C illustrates multiple passes of coating in varying directions for use on a wound dressing.
Figure 6C:
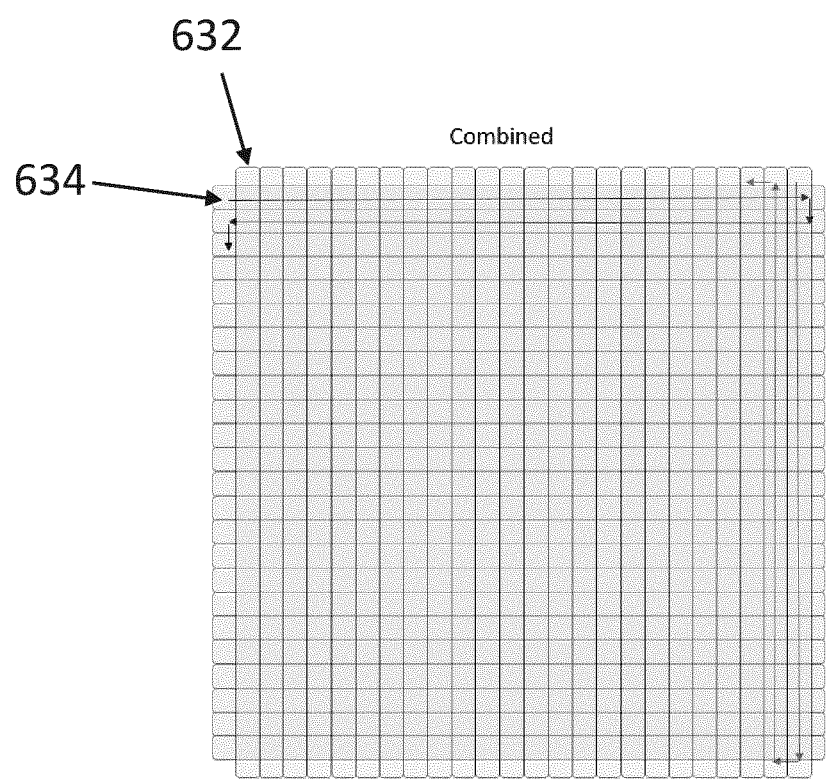

In some cases, the passes can be run in varying directions to reduce the likelihood of gaps forming at the low points/valleys or different depths of the features. For example, layer 2 can be applied transverse to layer 1. FIGS. 6A-6C illustrates an embodiment of multiple passes of coating in varying directions for use on a wound dressing. In some cases, the coating can be the soft coat as described with reference to FIGS. 2A-2D and FIG. 5.

FIG. 6A illustrates a first layer 632 application of a coating in a first direction. Each coating application or layer can be applied in a sinusoidal pattern as shown by the arrows in FIGS. 6A-6C. In other cases, each coating layer or application can be applied in parallel directions. The second layer 634 of coating can be applied in a second direction (for example, a transverse direction to the first layer) as shown in FIG. 6B. FIG. 6C illustrates the second layer 634 applied in a transverse direction over the first layer 632. For example, the first layer 632 can be applied in the horizontal direction and the second layer 634 can be applied in the vertical direction as illustrated in FIGS. 6A-6C.

In other cases, the multiple layers of coating can be applied in the same direction, but they can be offset appropriately to cover the differing depths or valleys created by the coating application. For example, layer 1 can have a step size of 4 mm and layer 2 can be applied at a step size of 4 mm but offset by 2 mm so the peaks of layer 1 meets the valleys of layer 2. In some cases, the subsequent layers can be applied after a curing of the first layer or prior to any curing of the first layer (for example, the layers can be stacked in liquid form).

Figures 7A, 7B:
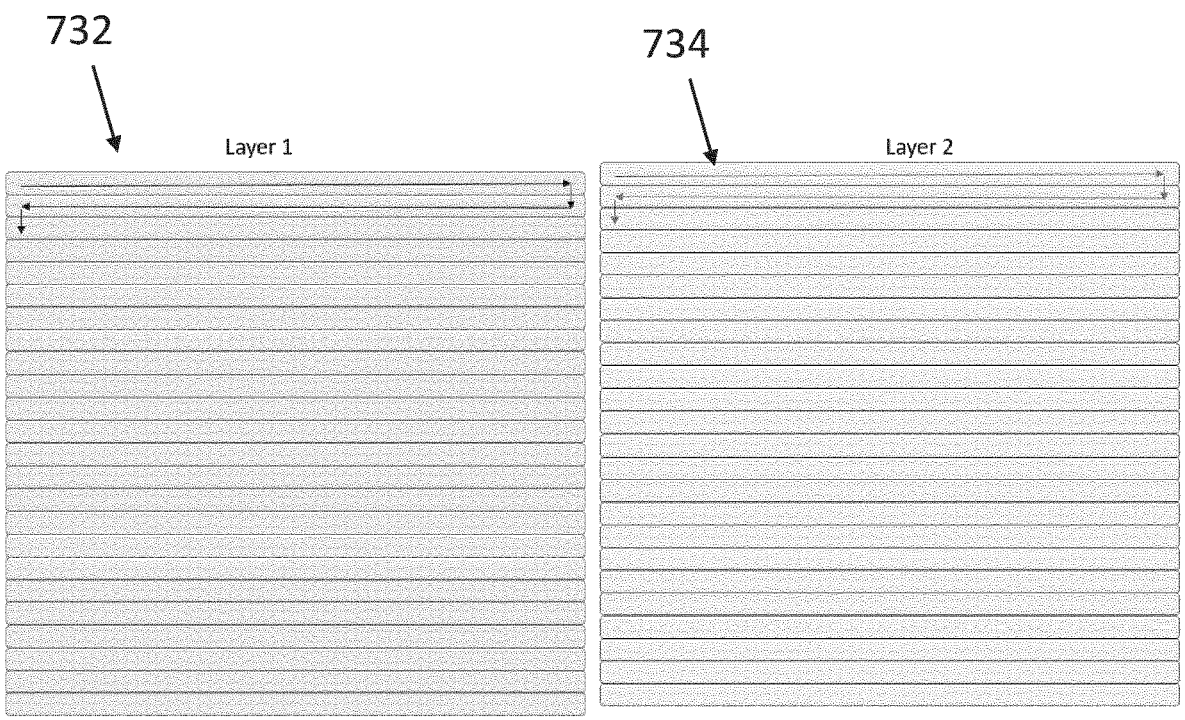
FIGS. 7A-7D illustrates multiple passes of coating in the same directions with offset application for use on a wound dressing.
Figure 7C:
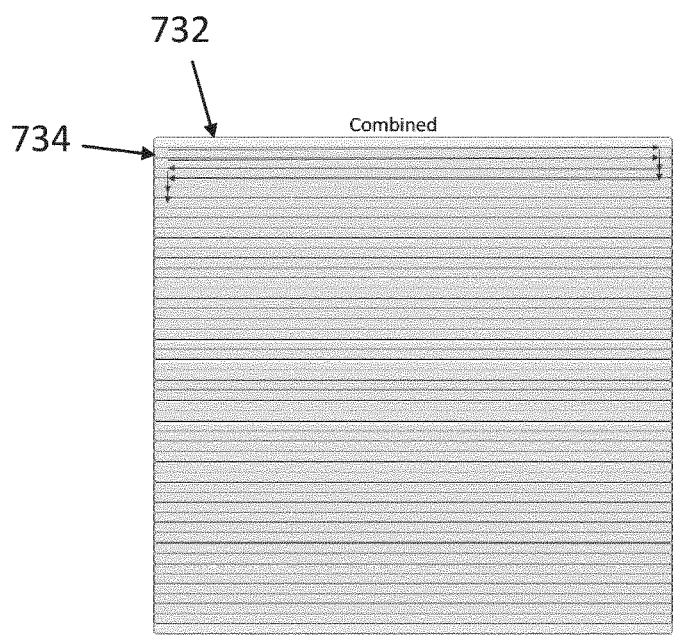
Figure 7D:
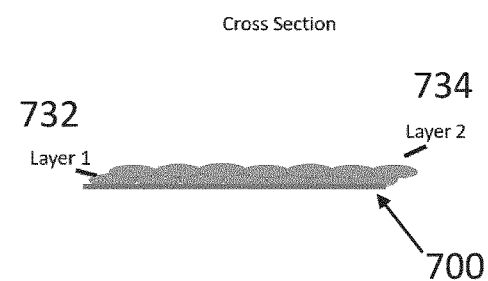

FIGS. 7A-7D illustrates an embodiment of multiple passes of coating in the same directions with offset application for use on a wound dressing. FIG. 7A illustrates the application of a first layer 732 of coating in a first direction and FIG. 7B illustrates the application of a second layer 734 in the same direction as the first direction that the first layer is applied in. Each coating application or layer can be applied in a sinusoidal pattern as shown by the arrows in FIGS. 7A-7C. In other cases, each coating layer or application can be applied in parallel directions. FIG. 7C illustrates the second layer 734 applied in the same direction but offset over the first layer 732. FIG. 7D illustrates a cross section of the first layer 732 and second layer 734 applied over a substrate 700. The cross section illustrates the valleys and peaks created by each pass of the layer when applied to the substrate. As illustrated in FIG. 7D, the second layer 734 is offset from the first layer 732 so that the peak of the first layer 732 is aligned with a valley of the second layer 734.

Although FIG. 7D shows the first and second layers offset to align the peak of one layer with the valley of another layer, the layers could be offset to any degree so as to apply more coverage for each area and not necessarily aligning each peak of the first layer with each valley of the second layer. The multiple passes of coating can produce a more even coating than a single application of coating applied to a substrate. In some cases, multiple passes of a soft coat can be applied to the substrate on the wound facing side and/or non-wound facing side. In some cases, the multiple passes of soft coat can be used in place of or in addition to the hard coat. When multiple passes of coating are applied to the substrate, the different layers can have different thicknesses. For example, the second layer can be less thick than the first layer or the first layer can be less thick than the second layer.

Figure 8A:
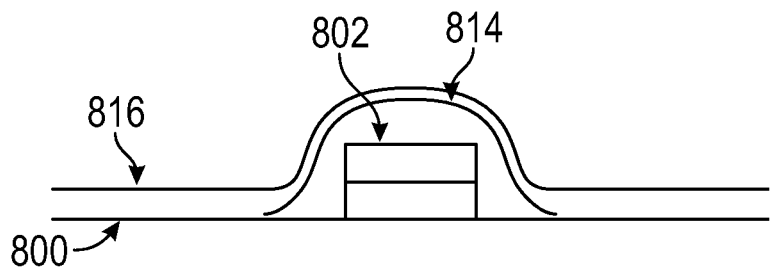
FIGS. 8A-8C illustrate cross-sections of a wound dressing.
Figure 8B:
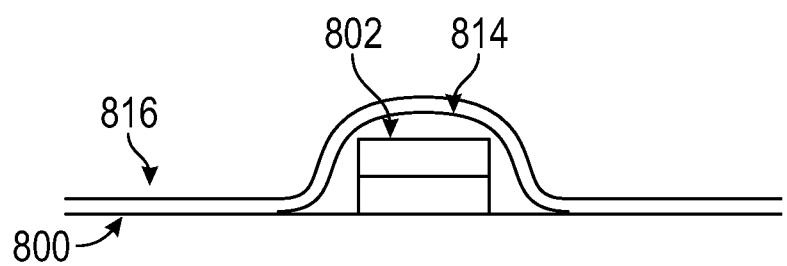
Figure 8C:
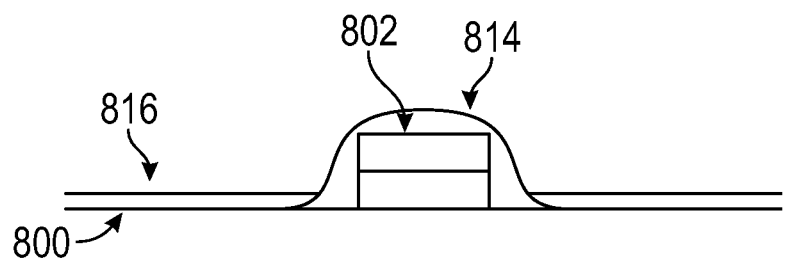

In some cases, the soft coat can be applied in one or more layers with varying thickness on the substrate surface. For example, the soft coat can have a thinner first region applied over the electronic components and/or connections or over the hard coat and a second region applied over the remainder of the substrate surface. For example, as illustrated in FIG. 8A, a first coat 814 can be applied over the electronic components and/or electronic connectors. The first coat 814 can be a hard coat as described herein. A second coat 816 can be applied with varying thickness over the substrate 800 and/or the first coat 814. The second coat 816 can be a soft coating as described herein. The second coat 816 can be applied with a thinner layer of second coat positioned over the first coat 814 and a thicker layer of the second coat 816 applied over the remainder of the substrate surface. In other cases, the soft coat can have a uniform or substantially homogenous thickness of the second coat 816 applied over the substrate 800 surface as illustrated in FIG. 8B. FIG. 8C illustrates a substrate with a first coat 814 applied over the electronic components and/or electronic connectors of the substrate. A second coat 816 can be applied over the substrate 800 while not covering a portion of or the entirety of the first coat 814 as illustrated in FIG. 8C.

Shape and Positioning of Coating

The coating is applied over the various components of the substrate. In such cases, consideration of the shape or thickness of the coating can be important to allow the substrate and components to function properly. For example, over optical sensors the coatings can form a lens like material for the light emitting and light receiving elements of the electronic components. Therefore, the bulk shape, surface angle, surface finish, refractive index and/or clarity of coat can be considered. Additionally, artefacts such as entrained air or other entrained foreign bodies which could scatter light can also be considered. Over thermal sensors the coatings can form an object of a given thermal mass. Consideration can be given to the bulk shape, surface finish, thermal contact with the wound, thermal transfer properties of the coating system and/or the effect of artefacts such as entrained air. The shape of the coating can be varied to account for some of these characteristics and provide optimal or a preferred environment for use of the particular sensors.

Figure 9A:
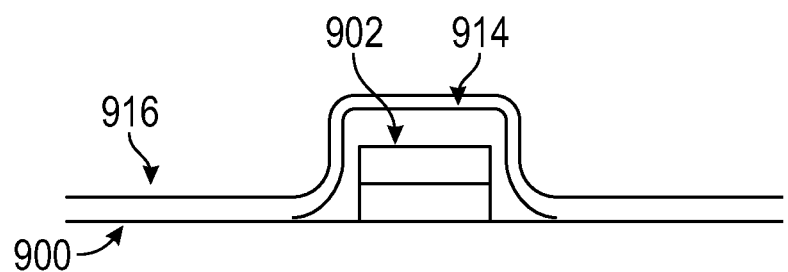
FIGS. 9A-9B illustrate cross-sections of a wound dressing.

In some case, the coating can be applied with a shape that approximates the component and/or connector on the substrate. FIG. 9A illustrates a first coating 914 (such as a hard coat) applied over the electronic component and/or connector 902 on the substrate 900. As illustrated in FIG. 9A, the first coating 914 can have a shape that approximates the profile of the electronic component and/or connector 902 on the substrate 900.

Figure 9B:
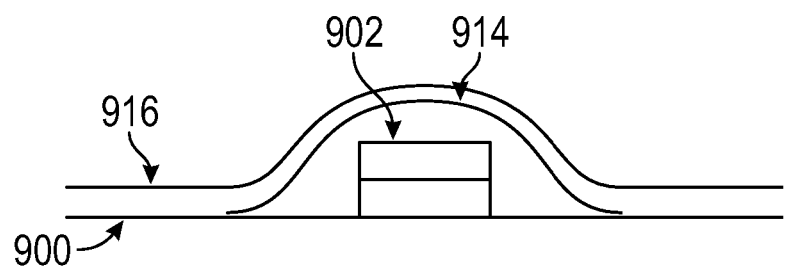

In some cases, the coating can have a profile that approximates a fixed slope to provide the appropriate characteristics for the components or sensors on the substrate. For example, the coating can approximate a lens or a polymer of a consistent thermal mass. FIG. 9B illustrates a substrate 900 with electronic component and/or connector 902. The electronic component and/or connector 902 can be covered by a first coating 914 (such as a hard coat). The first coating 914 can be shaped to approximate a fixed slope (such as a dome shape) to meet the desired characteristics.

FIGS. 9A-9B illustrate a second coating 916 applied over the substrate 900 and the first coating 914. FIGS. 9A-9B illustrate the first coating 914 applied over the electronic component and/or connector 902 and the second coating 916 applied over the entire surface of the substrate 900 including over the first coating 914. In some cases, the first coating 914 can be a hard coat or a soft coat as described herein. In some cases, the second coating 916 can be a hard coat or a soft coat as described herein. Although FIGS. 9A-9B illustrate both a first and second coating applied to the substrate, it can be understood that only the first coating can be used and the second coating is optional. In other cases, the first coating can be optional and only the second coating is used. In such cases, the second coating can be shaped as described with reference to the first coating in FIGS. 9A-9B but can cover the entire surface or substantially the entire surface of the substrate 900.

Figure 10A:
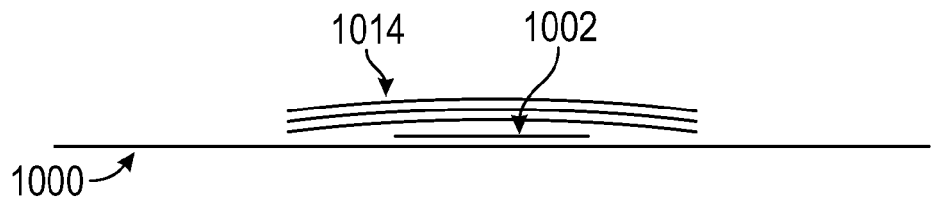
FIGS. 10A-10B illustrate cross-sections of a wound dressing.

The coating applied over impedance sensors can have a defined capacity and thickness which can be considered for functionality of the sensors during use. In some cases, a coating 1014 can be applied in multiple passes over the impedance sensors or any other sensor 1002 to ensure no gaps in coverage of the coating as shown in FIG. 10A.

Figure 10B:
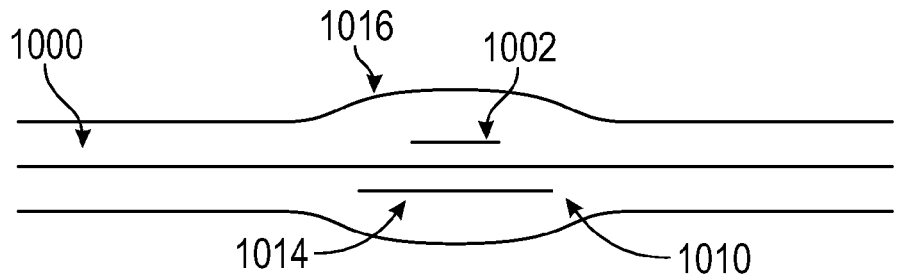
Figure 10C:
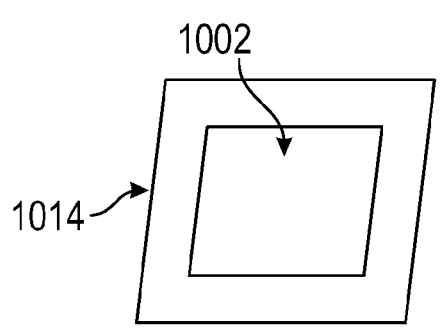
FIGS. 10C-10F illustrate patterns of coating for use with the substrate of a wound dressing.

The homogeneity of the coat and intimate contact with the wound can be important. The effect of artefacts such as entrained air can be considered. In some cases, it can be helpful to not apply the first coating or non-stretchable coating over the wound facing side of the impedance sensors. However, it can also be advantageous to avoid stretch or deformation of the impedance pads during reading over the wound. As such the first coating 1014 could be applied to the non-wound facing side of the substrate 1000 as shown in FIG. 10B. The first coating 1014 can be applied to the non-wound facing side of the substrate 1000 opposite the location of the component 1002 (such as an impedance sensor or other component) on the wound facing side of the substrate. The first coating can be a non-stretchable coating and can be used to prevent stretch and allow a consistent reading by mitigation of stretch on the impedance pads. The second coating 1016 can be applied to the wound facing side of the substrate. The third coating 1010 can be applied to the non-wound facing side of the substrate, layered over the first coating 1014 in some regions. The application of the first coating to the non-wound facing side of the substrate can be used for a wide range of sensors where there was a benefit to not applying the first coating to the component directly. A second coating 1016 (such as a soft coat) can be applied over the component 1002 wound facing side of the substrate 1000. A third coating 1010 can be applied over the non-wound facing side of the substrate 1000 and can cover the first coating 1014 as shown in FIG. 10B.

Figure 10E:
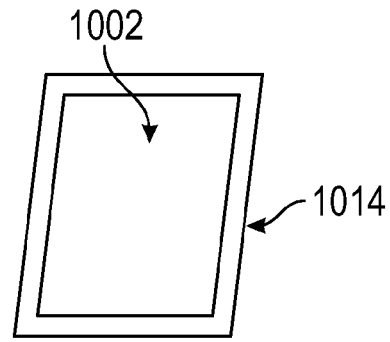
Figure 10D:
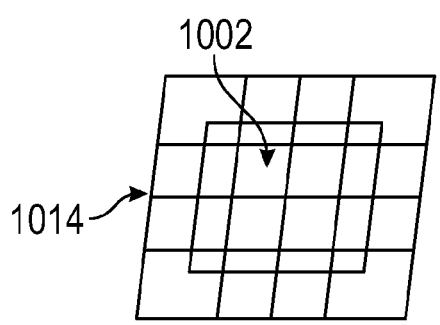
Figure 10F:
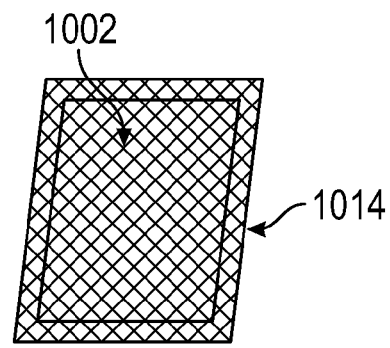

In some cases, first coat can be applied in various patterns, shapes, or application configurations to prevent local stretch of the film under the component when the first coat (non-stretchable coating) is applied to the non-wound facing side of the substrate. As shown in FIGS. 10C-10F, various shapes, patterns, or configurations of the first coating can be applied to the non-wound facing side of the substrate. In some cases, the first coating on the non-wound facing side of the substrate can cover most or all of the component footprint as shown in FIG. 10E. In some cases, the first coating on the non-wound facing side of the substrate can cover a perimeter of the component footprint as shown in FIG. 10E or cover an area outside of the perimeter of the component footprint as shown in FIG. 10O. In some cases, the first coating on the non-wound facing side of the substrate can cover the component footprint with a design, for example a hash pattern as shown in FIG. 10D or any other design that mitigates stretch.

When positioned over other components that form the electrical circuit the coatings can form objects of given thermal mass. Consideration can be given to any thermal effects which could impede performance of the system or have an impact on the patient, such as the heating of components.

Coating Options

As described herein, the coating (for example the soft coat) can be a hydrophilic material. For example, the soft coat can be an acrylated urethane. The coating can be a biocompatible coating. Other materials can be used for the coating to provide the characteristics necessary for the substrate and utilizing the sensors or other components. In some cases, a silicone material can be used in addition to or place of the one or more coatings. For example, an RTV-2 silicone or similar material can be used to cover or encapsulate the electronic components, connectors, and/or tracks. In such cases, the silicone material could be applied to the wound facing and/or non-wound facing surface of the substrate. In some cases, a first coating (such as the hard coat or soft coat material described herein) can be applied to the wound facing side of the substrate at an area of the substrate that supports the electronic components and/or electronic connectors. The remainder of the substrate and the first coating can then be covered or coated with a silicone material coating. In such cases, the silicone material can be used as the second coating 216 is described with reference to FIGS. 2A-2D. The dressing including the substrate and the silicone material can be perforated as described herein.

The silicone material can be applied to one side of the substrate and the substrate and silicone material can be perforated. A second silicone material can be applied to a second side of the substrate and the dressing can be perforated a second time. In some cases, the two step perforation process can allow the inner wall of the perforation to be coated or encapsulated with the silicone material. A similar process is described in U.K. Patent Application No. 1918856.4, Dec. 19, 2019, titled SENSOR INTEGRATED DRESSINGS AND SYSTEMS, which is incorporated by reference in its entirety. In some cases, the substrate can be laminated on both the wound facing side and the non-wound facing side with an adhesive material such as an adhesive film or sheet. The adhesive material film or sheet can be an impermeable, extensible and flexible material.

In some cases, different materials can be used for the various coatings which can allow for different characteristics of the coatings to be used in combination with the substrate and components. For example, with reference to FIG. 2A-2D, the first coating 214 is provided over the electronic components or connectors of the substrate and a second coat 216 can be provided over the wound facing side of the substrate and over the first coating 214. An additional third coating 219 can be provided on the non-wound facing side of the substrate.

In some cases, the first coating and the second coating can be the same material. For example, a soft coating can be used as the first coating to cover the electronic components and/or connectors and the same soft coating material can be used as the second coating covering the wound facing side of the substrate including covering the first coating. The use of a soft coat materials or the conformable coat materials as described herein for both the first and second coating can allow for increased stretch of the dressing while still allowing the electronic components and connections to be functional under a stretched condition.

In some cases, the sequence of application of the first and second coating can be reversed. For example, the second coating can be applied to the entirety of the wound facing side of the substrate and then the first coating can be applied to the wound facing side of the substrate at regions of the substrate supporting the electronic components and/or electronic connections. This can provide for a thicker coating over the electronic components and/or connections. If the coating material used for the second coating and the first coating are the same material, this can allow for the regions of the substrate supporting the electronic components and/or electronic connections to have an additional layer of the coating providing better protection for those regions from the wound.

In some cases, the first coating and the second coating can be cured separately where the curing process occurs between each application of the coating layer. In other cases, the first coating and second coating can be cured at one time after application of both coats are applied to the wound facing side of the substrate. In those cases, since the coatings are cured at one time, they can appear as one coating with a thicker layer of coating localized over the areas with electronic components and/or electronic connections. This is particularly true when the first coating and the second coating utilize the same material. In such cases, the first coating and the second coating can be considered one coating in the end product with thicker, reinforced areas over the electronic components and/or electronic connections. In such cases, the first coating can be stretchable or substantially stretchable as it uses the conformable coat or soft coat material as described herein. However, in some cases, the regions with the thicker double coating can be less stretchable than the areas of the substrate with only a thin layer of coating applied over the entire wound facing surface.

In some cases, instead of a first coating and a second coating being applied to the wound facing side of the substrate, only one layer of coating can be applied to the wound facing side of the substrate. In such cases, it may be necessary to apply a thicker single coating to the entire surface of the substrate compared to the thickness of the second coating applied during the two coating application process. Therefore, in some cases, the single layer of coating may be thicker and therefore less stretchable than the coating on the entirety of the dressing that is applied by the two coating process. For example, the single layer of coating can have a thickness between 10 to 600 µm (about 10 to 600 µm). the single layer of coating can have a thickness between 10 to 1200 µm (about 10 to 1200 µm).

In some cases, a fourth coating can be applied to the wound facing side of the substrate to the area or region of the substrate the supports the electronic components and/or electronic connectors to reinforce or further protect the electronic components and/or electronic connectors. In some cases, one or more of the first coating 214, second coating 216, third coating 210, and fourth coating (not shown) can be the same material. In such cases, one or more of the first coating 214, second coating 216, third coating 210, and fourth coating can be the conformable coat or soft coat described herein.

In some cases, one or more of the first coating 214, second coating 216, third coating 210, and fourth coating (not shown) can be flexible but not stretchable. For example, a layer of Parylene-C can be used to cover the substrate. In such cases, the Parlyene-C layer can be a few microns thick, for example, between 1 to 10 microns thick. In some cases, the layer of Parylene-C can be between 1 to 600 µm (about 1 to 600 µm) thick. The primer treatment layer can be between 1 to 500 µm (about 1 to 500 µm), between 1 to 200 µm (about 1 to 200 µm), between 1 to 130 µm (about 1 to 130 µm) or between 1 to 10 µm (about 1 to 10 µm) thick. The Parlyene-C layer can maintain the flexibility of the substrate, but it may reduce the extensibility or stretchability in some cases. In some cases, the Parylene-C can be used as described herein with reference to a primer treatment on the substrate.

In some cases, one or more of the first coating 214, second coating 216, third coating 210, and fourth coating (not shown) or any of the coatings described herein can be optically clear, transparent, and/or colorless.

Wicking of Coating Material

It can be useful to utilize a wicking layer or wicking material on the non-wound facing side of the substrate as described herein with reference to FIGS. 2A-2B. In other cases, the coating on the non-wound facing side of the substrate (for example, third coating 210) can be a hydrophilic material that can draw liquid from the wound through the substrate and into any additional dressings or dressing layers used in combination with the substrate. The third coating can have a substrate contacting side and an opposite non-substrate contacting side. To provide the wicking action through the substrate, the third coating can be a material that is insulating to liquid and that protects the non-wound facing side of the substrate as described herein with reference to the third coating 210. However, the outer surface or non-substrate contacting side of the third coating can be hydrophilic to draw the fluid through the dressing. In some cases, this can be accomplished by using a material for the third coating with modified surface properties.

Figure 11:
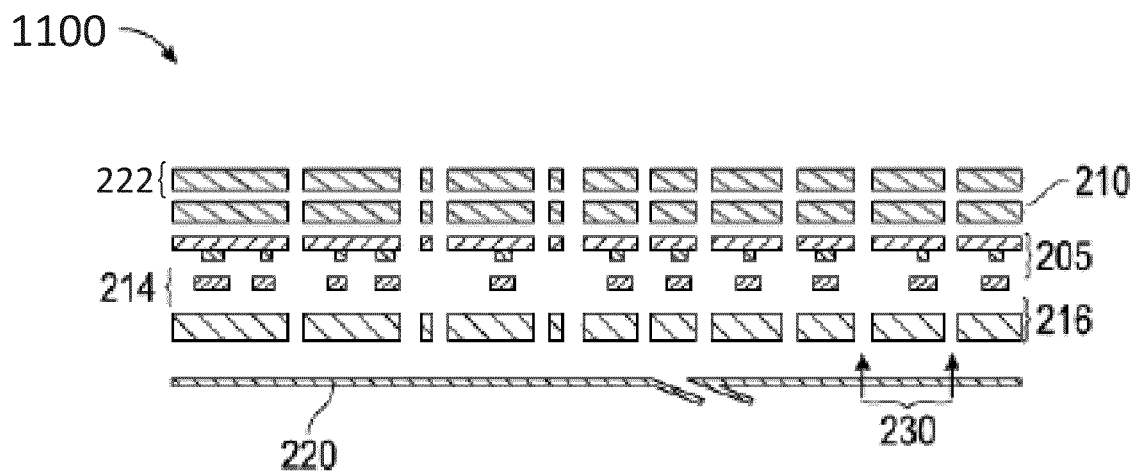
FIG. 11 illustrates a cross-section of a wound dressing.

In other cases, that could be accomplished with a two coating system applied to the non-wound facing side of the substrate as shown in FIG. 11. FIG. 11 can be similar to FIGS. 2C and 2D, however, FIG. 11 uses an additional coating on the non-wound facing side of the substrate. The additional coating 222 can be applied over the third coating 210. The third coating 210 as described herein can be used and applied directly to the substrate 205. The third coating can be covered by an additional coating 222 that can be a hydrophilic material providing a wicking system to draw fluid through the perforations in the substrate.

In some cases, the first coating 214 and second coating 216 can be applied to the wound facing side of the substrate 205 and then the substrate can be perforated 230. The third coating 210 can then be applied to the non-wound facing side of the substrate. In some cases, the inner wall of the perforations can be coated through the application of the third coating as the coating material in its liquid state will flow through the perforations thereby coating the inner wall of the perforations. This can provide encapsulation of the substrate by covering or coating the inner wall of the perforations. The third coat can be cured prior to applying any additional layers. In some cases, this encapsulation can be a hydrophobic material encapsulation. More details on coating of the inner wall of the perforations are described with in U.K. Patent Application No. 1918856.4, Dec. 19, 2019, titled SENSOR INTEGRATED DRESSINGS AND SYSTEMS, which is incorporated by reference in its entirety. The additional hydrophilic coating 222 can be applied over the third coating 210 on the non-wound facing side of the substrate 205 and can also flow into the perforations 230 and thereby apply an additional coating over the inner wall of the perforations with the hydrophilic coating. This can create a perforation with an inner wall that is encapsulated with a hydrophobic coating and then treated with an additional hydrophilic coating to encourage fluid transfer through the perforations to the non-wound facing side of the substrate.

In some cases, the coated substrate can be encapsulated with a silicone layer formed from a silicone material. The silicone layer can be an additional coating layer over the substrate and/or over any coating on the substrate. In some cases, the silicone layer can be the outermost layer of the coated substrate.

The additional silicone layer can be applied to the wound facing side and/or the non-wound facing side of the coated substrate. In some cases, the additional coating can be used in place of or in addition to any coating described herein. The silicone layer can be used in combination with any combination of coatings described herein. For example, the silicone layer can be applied over the second and third coating described herein thereby encapsulating the coated substrate with a silicone material. In other cases, only one side of the substrate can be coated with a silicone layer. The substrate can be perforated before or after any of the coatings are applied including before or after the silicone layer is applied. In some cases, the silicone layer can provide a barrier to water and moisture to protect the electronics on the substrate.

As used herein, each application of a coating material or coating layer can be followed by a curing step that cures the coating material or coating layer. In other cases, as used herein, the coating materials and coating layer need not be cured between each coating application and the coating material or coating layers can be cured after all layers are applied or between any application of any coating material or coating layer.

In some cases, each of one or more of the coatings described herein can have a thickness of between 10 to 600 µm (about 10 to 600 µm). Each of one or more of the coatings can have a thickness of between 10 to 500 µm (about 10 to 500 µm), between 10 to 200 µm (about 10 to 200 µm), or between 18 to 130 µm (about 18 to 130 µm). Each of the one or more coatings can have a thickness of 135 µm (about 135 µm). In some cases, the one or more coatings can comprise a thickness of between 10 to 600 µm (about 10 to 600 µm) combined. The one or more of the coatings can have a thickness of between 10 to 500 µm (about 10 to 500 µm), between 10 to 200 µm (about 10 to 200 µm), or between 18 to 130 µm (about 18 to 130 µm) combined. The one or more of the coatings can have a thickness of 135 µm (about 135 µm) combined.

In some cases, the coatings or layers described herein can have a uniform or homogenous thickness (or substantially uniform or homogenous thickness) over the substrate including over the electronic components, electronic connection, and/or electronic tracks.

In some cases, a single coating or layer described herein can be used and applied with varying thickness. The non-homogenous thickness of the coating can allow for a greater thickness applied over the electronic components and/or electronic connectors while a less thick layer of the same or a different coating can be applied over the remainder of the substrate. The non-homogenous thickness of coating can be created using multiple layers of material applied, multiple passes used for application of the coating, and/or one pass of coating applying varying thickness of coating in discrete areas on the substrate and/or over the electronic components and/or electronic connectors.

Other Variations

In some cases, one or more electronic components can be positioned on the side of a substrate opposite the side that faces the wound. Systems and methods described herein are equally applicable to such wound contact layers. Although certain embodiments described herein relate to wound dressings, systems and methods disclosed herein are not limited to wound dressings or medical applications. Systems and methods disclosed herein are generally applicable to electronic devices in general, such as electronic devices that can be worn by or applied to a user.

Any value of a threshold, limit, duration, etc. provided herein is not intended to be absolute and, thereby, can be approximate. In addition, any threshold, limit, duration, etc. provided herein can be fixed or varied either automatically or by a user. Furthermore, as is used herein relative terminology such as exceeds, greater than, less than, etc. in relation to a reference value is intended to also encompass being equal to the reference value. For example, exceeding a reference value that is positive can encompass being equal to or greater than the reference value. In addition, as is used herein relative terminology such as exceeds, greater than, less than, etc. in relation to a reference value is intended to also encompass an inverse of the disclosed relationship, such as below, less than, greater than, etc. in relations to the reference value. Moreover, although blocks of the various processes may be described in terms of determining whether a value meets or does not meet a particular threshold, the blocks can be similarly understood, for example, in terms of a value (i) being below or above a threshold or (ii) satisfying or not satisfying a threshold.

Features, materials, characteristics, or groups described in conjunction with a particular aspect, embodiment, or example are to be understood to be applicable to any other aspect, embodiment or example described herein unless incompatible therewith. All of the features disclosed in this specification (including any accompanying claims, abstract and drawings), or all of the steps of any method or process so disclosed, may be combined in any combination, except combinations where at least some of such features or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. Those skilled in the art will appreciate that in some cases, the actual steps taken in the processes illustrated or disclosed may differ from those shown in the figures. Depending on the embodiment, certain of the steps described above may be removed, others may be added. For example, the actual steps or order of steps taken in the disclosed processes may differ from those shown in the figure. Depending on the embodiment, certain of the steps described above may be removed, others may be added. For instance, the various components illustrated in the figures may be implemented as software or firmware on a processor, controller, ASIC, FPGA, or dedicated hardware. Hardware components, such as controllers, processors, ASICs, FPGAs, and the like, can include logic circuitry. Furthermore, the features and attributes of the specific embodiments disclosed above may be combined in different ways to form additional embodiments, all of which fall within the scope of the present disclosure.

Although the present disclosure includes certain embodiments, examples and applications, it will be understood by those skilled in the art that the present disclosure extends beyond the specifically disclosed embodiments to other alternative embodiments or uses and obvious modifications and equivalents thereof, including embodiments which do not provide all of the features and advantages set forth herein. Accordingly, the scope of the present disclosure is not intended to be limited by the specific disclosures of preferred embodiments herein, and may be defined by claims as presented herein or as presented in the future.

Conditional language, such as "can," "could," "might," or "may," unless specifically stated otherwise, or otherwise understood within the context as used, is generally intended to convey that certain embodiments include, while other embodiments do not include, certain features, elements, or steps. Thus, such conditional language is not generally intended to imply that features, elements, or steps are in any way required for one or more embodiments or that one or more embodiments necessarily include logic for deciding, with or without user input or prompting, whether these features, elements, or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A method for coating a wound dressing, the method for coating the wound dressing comprising:

applying a first coating on a first side of a substantially flexible substrate of the wound dressing, the first side of the substantially flexible substrate supporting a plurality of electronic components, electronic tracks, and a plurality of connectors between the plurality of electronic components and electronic tracks, wherein the first coating is applied to at least one connector of the plurality of connectors or to at least one electronic component of the plurality of electronic components to reinforce the at least one connector or the at least one electronic component;

applying a second coating on the first side of the substantially flexible substrate, wherein the second coating comprises a first layer and a second layer, wherein the first layer is applied in a first direction and the second layer is applied in a second direction that is transverse to the first direction; and coating a second side of the substantially flexible substrate opposite the first side with a third coating.

2. The method for coating the wound dressing of claim 1, further comprising coating at least one of the plurality of electronic components with a fourth coating.

3. The method for coating the wound dressing of claim 1, further comprising a plurality of perforations formed through the second coating and the substantially flexible substrate, the plurality of perforations configured to facilitate passage of fluid.

4. The method for coating the wound dressing of claim 1, wherein the third coating comprises a same material as that of the second coating applied to the first side of the substantially flexible substrate.

5. The method for coating the wound dressing of claim 1, wherein the third coating comprises a different material from that of the second coating applied to the first side of the substantially flexible substrate.

6. The method for coating the wound dressing of claim 1, wherein the plurality of electronic components comprise a plurality of sensors configured to obtain measurements of a wound, at least one of the plurality of sensors interconnected by a plurality of electronic connections.

7. A wound dressing apparatus comprising the wound dressing coated according to the method for coating the wound dressing of claim 1.

* * * * *